(12) United States Patent
Gu et al.

(10) Patent No.: US 10,825,832 B2
(45) Date of Patent: Nov. 3, 2020

(54) SEMICONDUCTOR DEVICE INCLUDING GATES

(71) Applicant: SAMSUNG ELECTRONICS CO., LTD., Suwon-si (KR)

(72) Inventors: Ji Mo Gu, Seoul (KR); Kyeong Jin Park, Seoul (KR); Hyun Mog Park, Seoul (KR); Byoung Il Lee, Seoul (KR); Tak Lee, Hwaseong-si (KR); Jun Ho Cha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/780,999

(22) Filed: Feb. 4, 2020

(65) Prior Publication Data

US 2020/0176470 A1 Jun. 4, 2020

Related U.S. Application Data

(63) Continuation of application No. 15/933,695, filed on Mar. 23, 2018, now Pat. No. 10,553,605.

(30) Foreign Application Priority Data

Jul. 17, 2017 (KR) .......................... 10-2017-0090215

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ......... H01L 27/11582; H01L 27/11524; H01L 27/11548; H01L 27/11556;
(Continued)

(56) References Cited

U.S. PATENT DOCUMENTS 8,592,890 B2 11/2013 Watanabe et al.
8,648,404 B2 2/2014 Ko et al.
(Continued)

OTHER PUBLICATIONS

Search Report and Written Opinion dated Sep. 24, 2018 in corresponding Singapore Patent Application No. 10201805233P (12 pages).

*Primary Examiner* — Shahed Ahmed
(74) *Attorney, Agent, or Firm* — F. Chau & Associates, LLC

(57) ABSTRACT

A semiconductor device includes first gate electrodes including a first lower electrode, a first upper electrode disposed above the first lower electrode and including a first pad region, and one or more first intermediate electrodes disposed between the first lower electrode and the first upper electrode. Second gate electrodes include a second lower electrode, a second upper electrode disposed above the second lower electrode, and one or more second intermediate electrodes disposed between the second lower electrode and the second upper electrode. The second gate electrodes are sequentially stacked above the first upper electrode, while exposing the first pad region. The first lower electrode extends by a first length, further than the first upper electrode, in a first direction. The second lower electrode extends by a second length, different from the first length, further than the second upper electrode, in the first direction.

20 Claims, 37 Drawing Sheets

(51) Int. Cl.
*H01L 27/11556* (2017.01)
*H01L 27/11575* (2017.01)
*H01L 27/11548* (2017.01)
*H01L 27/11524* (2017.01)
*H01L 27/1157* (2017.01)

(52) U.S. Cl.
CPC .. *H01L 27/11548* (2013.01); *H01L 27/11556* (2013.01); *H01L 27/11565* (2013.01); *H01L 27/11575* (2013.01)

(58) Field of Classification Search
CPC ........... H01L 27/11565; H01L 27/1157; H01L 27/11575; H01L 2924/1451; H01L 27/115–11597; H01L 2924/14511; G11C 16/00–349
See application file for complete search history.

(56) References Cited

U.S. PATENT DOCUMENTS

| | | |
|---|---|---|
| 8,951,859 B2 | 2/2015 | Higashitani et al. |
| 9,165,823 B2 | 10/2015 | Chen |
| 9,337,040 B1 | 5/2016 | Renau et al. |
| 9,343,452 B2 | 5/2016 | Yun et al. |
| 9,530,742 B1 | 12/2016 | Jung et al. |
| 2012/0061744 A1 | 3/2012 | Hwang et al. |
| 2012/0193705 A1* | 8/2012 | Lim .................. H01L 27/11575 257/330 |
| 2012/0319173 A1 | 12/2012 | Ko et al. |
| 2014/0141610 A1 | 5/2014 | Jin et al. |
| 2014/0183756 A1 | 7/2014 | Hwang et al. |
| 2015/0085579 A1* | 3/2015 | Chen .................. H01L 27/11582 365/185.17 |
| 2015/0194435 A1* | 7/2015 | Lee .................. H01L 27/11575 257/329 |
| 2015/0287710 A1 | 10/2015 | Yun et al. |
| 2016/0027796 A1* | 1/2016 | Yang .................. H01L 27/11573 257/314 |
| 2016/0035732 A1 | 2/2016 | Lee et al. |
| 2016/0268287 A1 | 9/2016 | Park et al. |
| 2016/0293539 A1* | 10/2016 | Park .................. H01L 27/11548 |
| 2016/0322376 A1 | 11/2016 | Lee |
| 2017/0200676 A1 | 7/2017 | Jeong et al. |
| 2019/0019807 A1 | 1/2019 | Gu et al. |

\* cited by examiner

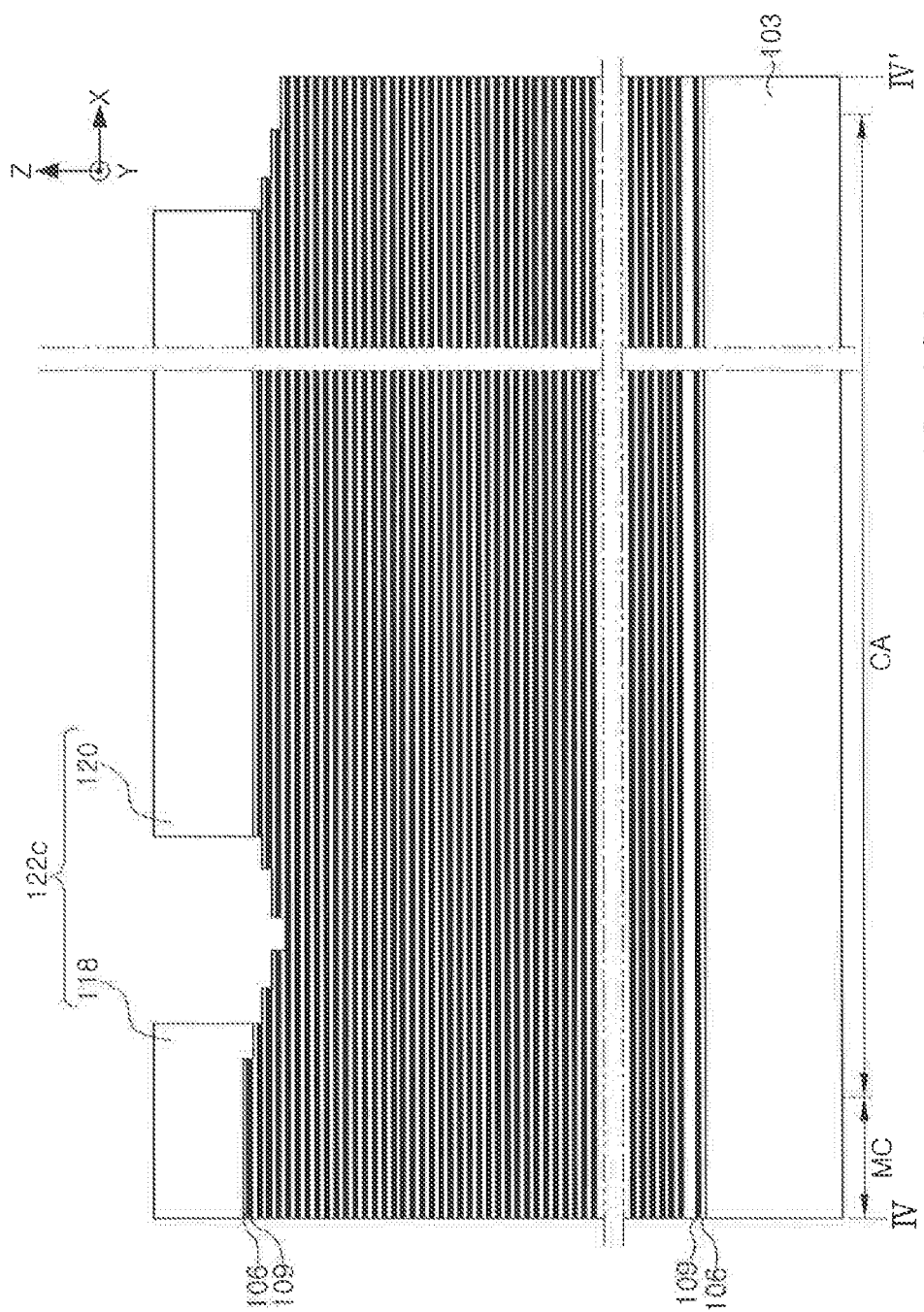

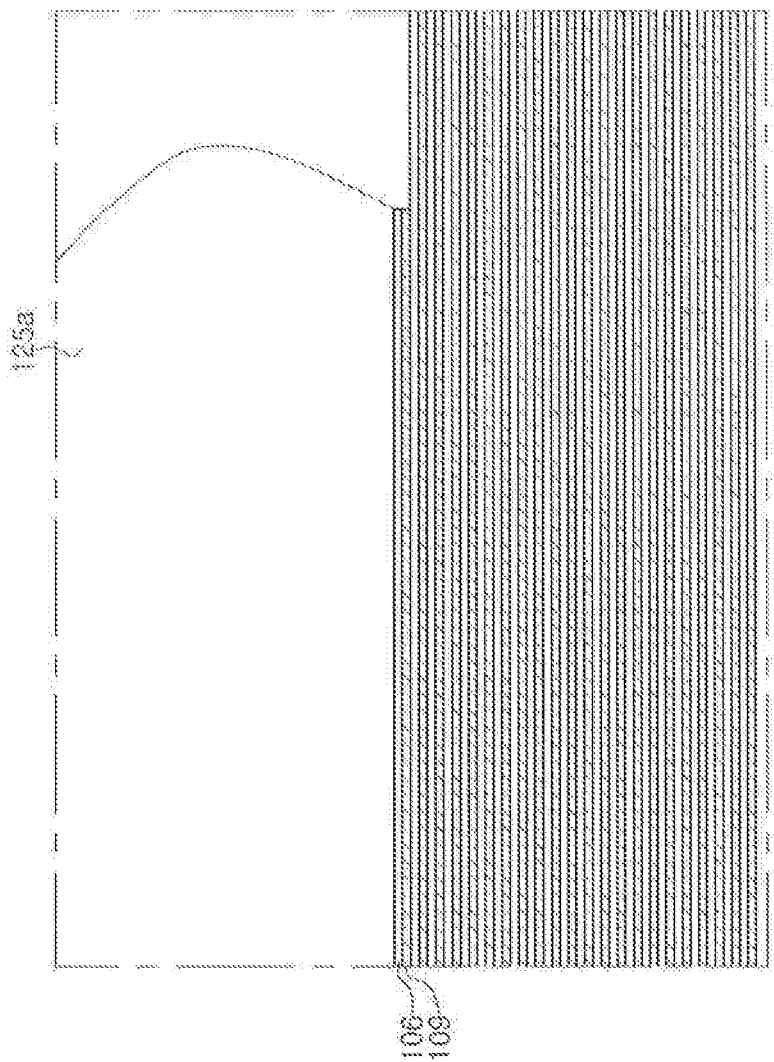

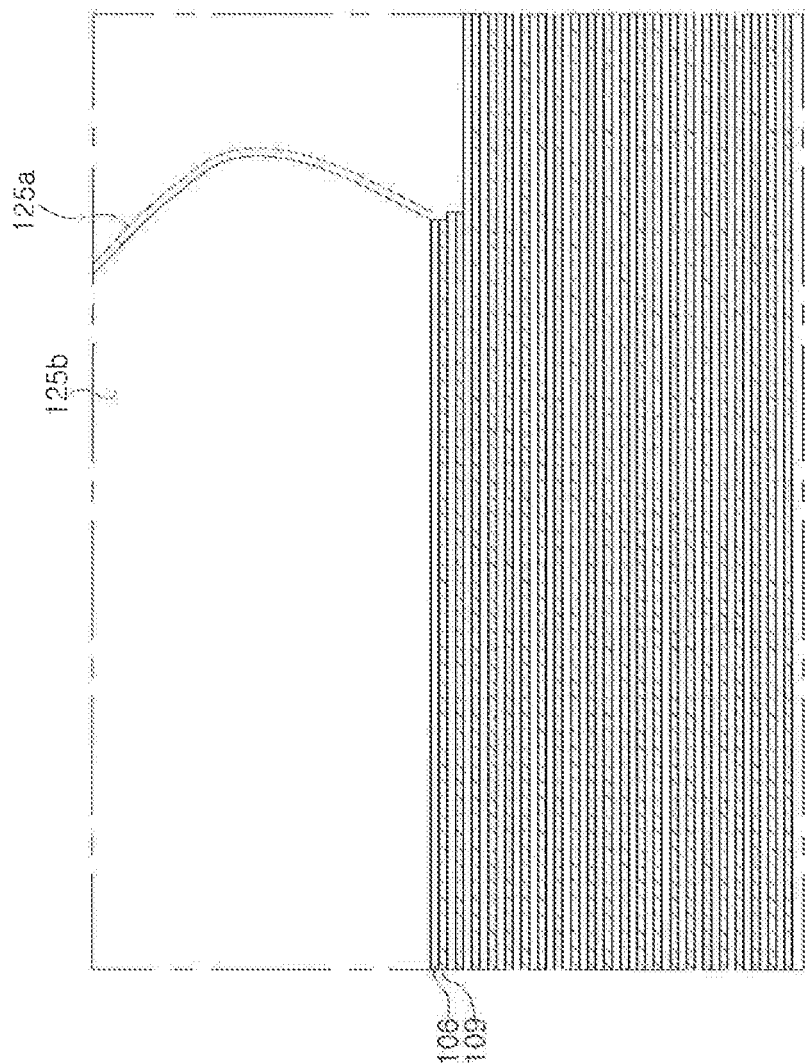

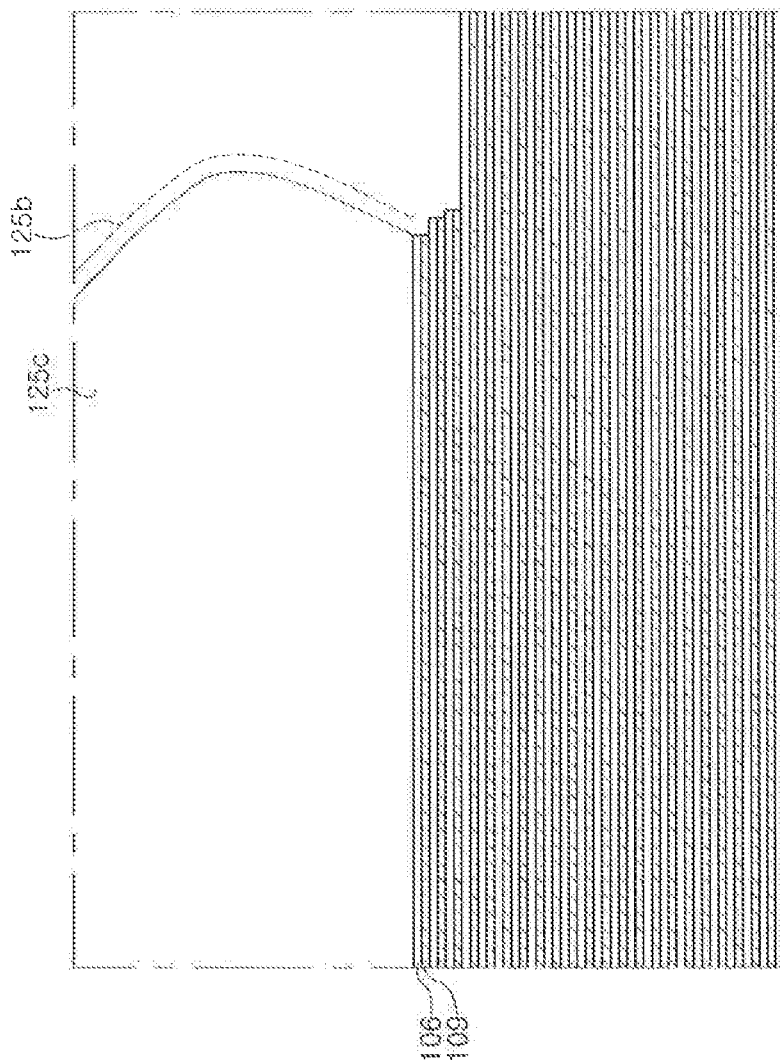

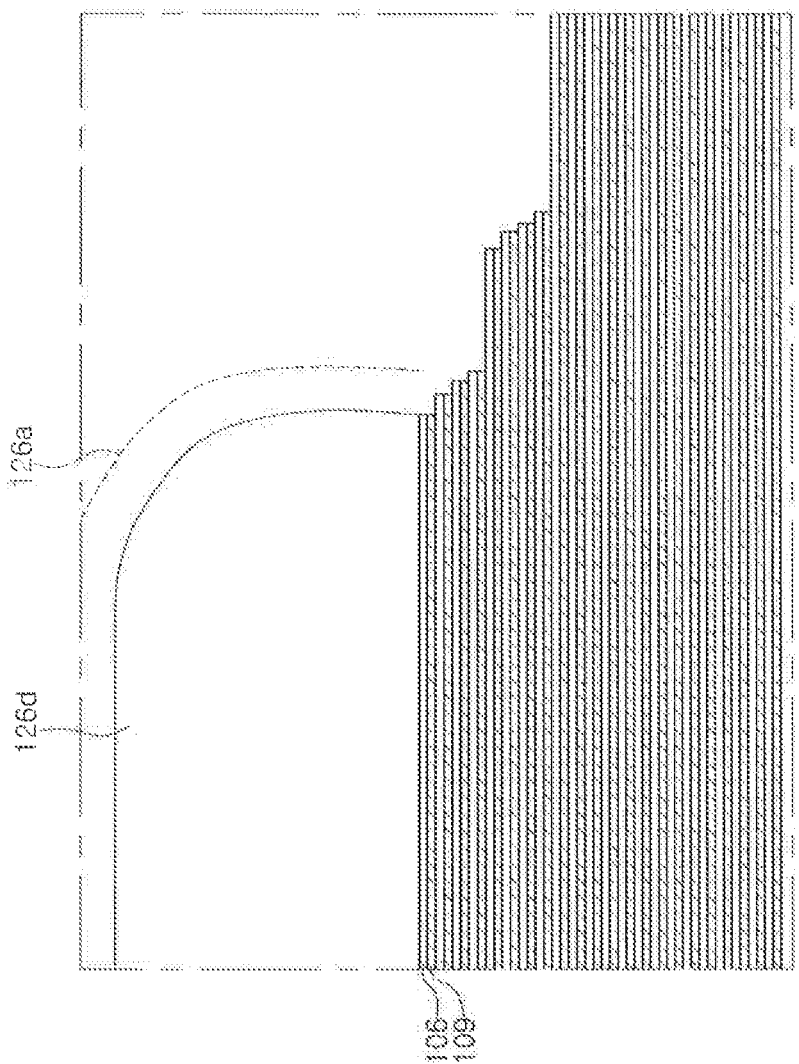

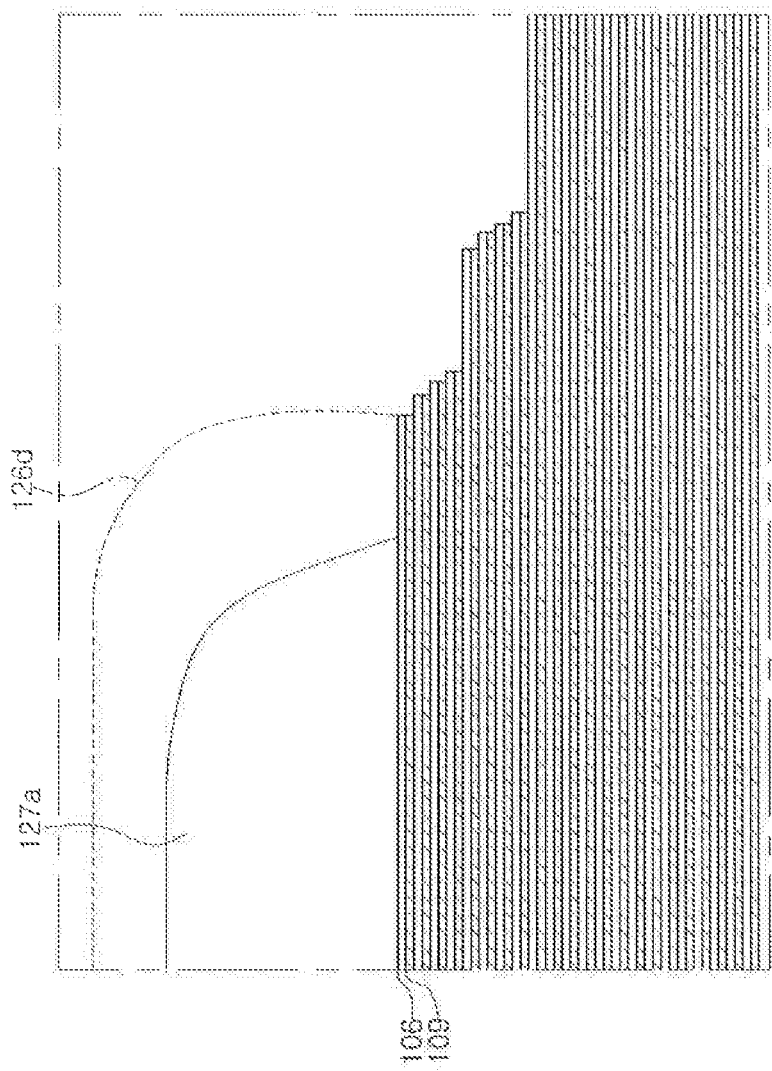

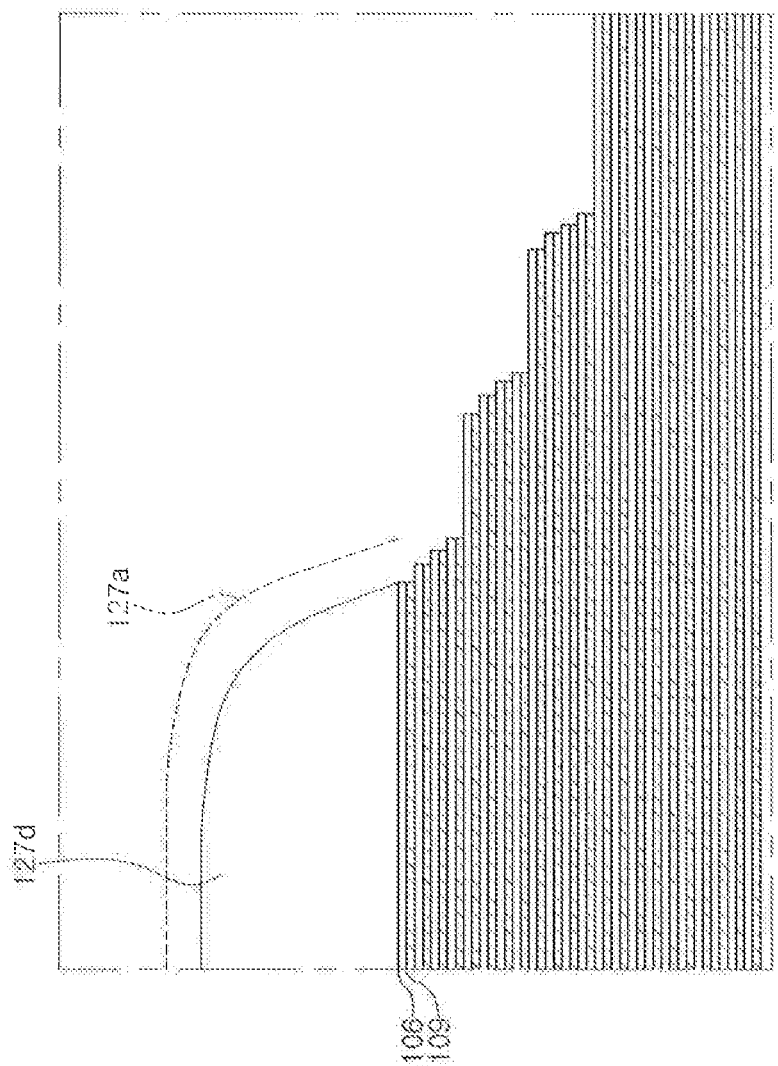

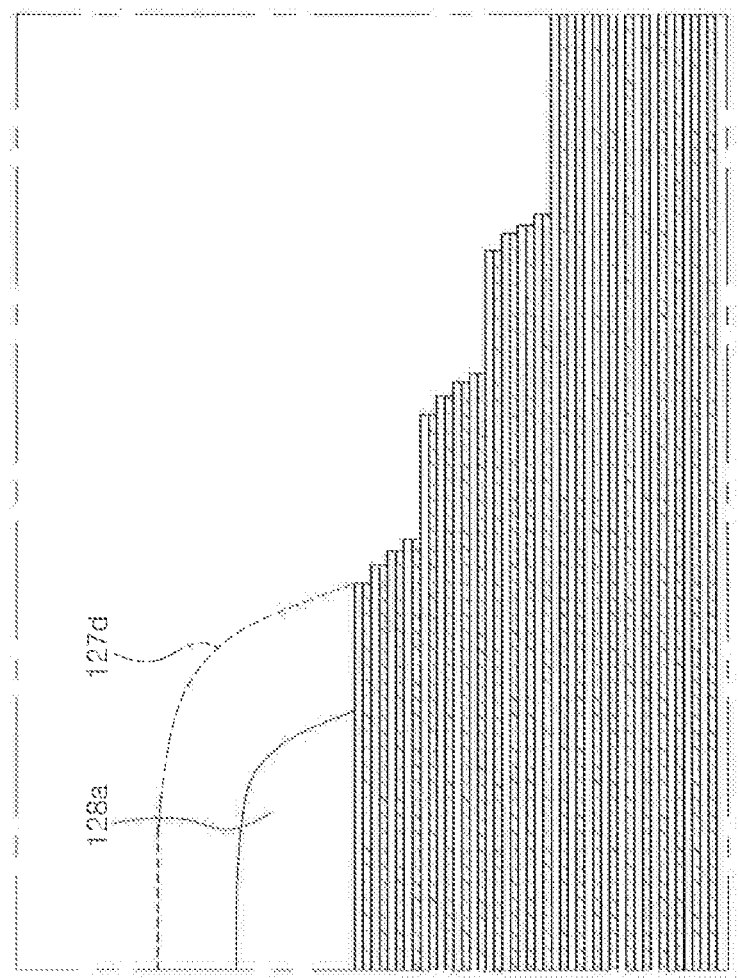

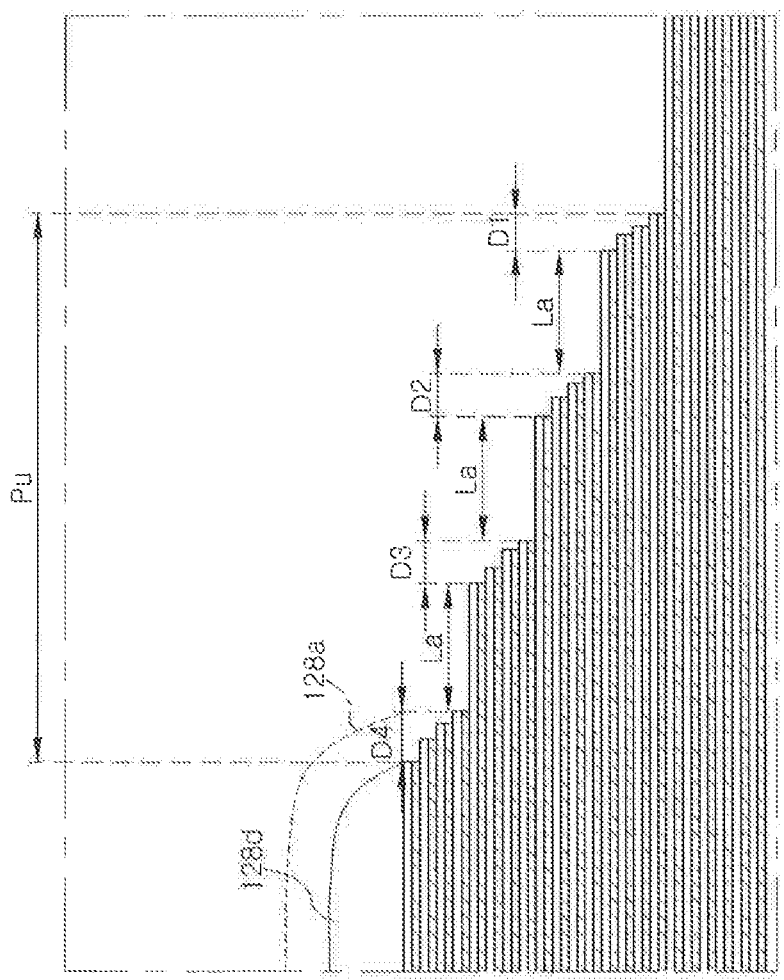

SEMICONDUCTOR DEVICE INCLUDING GATES

CROSS-REFERENCE TO RELATED APPLICATIONS

This application is a continuation of U.S. patent application Ser. No. 15/933,695 filed on Mar. 23, 2018, which claims priority under 35 U.S.C. § 119 to Korean Patent Application No. 10-2017-0090215 filed on Jul. 17, 2017 in the Korean Intellectual Property Office, the disclosures of which are incorporated by reference herein in their entireties.

1. TECHNICAL FIELD

Exemplary embodiments of the present inventive concept relate to a semiconductor device, and more particularly, to a semiconductor device including gates.

2. DISCUSSION OF RELATED ART

A degree of integration of semiconductor devices has been increasing. Relatively highly integrated semiconductor devices having a three-dimensional structure have been developed.

SUMMARY

An exemplary embodiment of the present inventive concept provides a semiconductor device including three-dimensionally arranged pad regions.

An exemplary embodiment of the present inventive concept provides a semiconductor device including gates including pad regions in which bridge defects may be prevented.

A semiconductor device according to an exemplary embodiment of the present inventive concept includes first gate electrodes including a first lower electrode, a first upper electrode disposed above the first lower electrode and including a first pad region, and one or more first intermediate electrodes disposed between the first lower electrode and the first upper electrode. Second gate electrodes include a second lower electrode, a second upper electrode disposed above the second lower electrode, and one or more second intermediate electrodes disposed between the second lower electrode and the second upper electrode. The second gate electrodes are sequentially stacked above the first upper electrode, while exposing the first pad region along a direction orthogonal to an upper surface of the first upper electrode. The first lower electrode extends by a first length, further than the first upper electrode, in a first direction. The second lower electrode extends by a second length, different from the first length, further than the second upper electrode, in the first direction.

A semiconductor device according to an exemplary embodiment of the present inventive concept includes a memory cell region and a contact region. Gate electrodes are disposed on the memory cell region of the substrate and extend into the contact region. The gate electrodes include word lines having word line pad regions, and upper gate lines disposed on the word lines and having upper pad regions. The word line pad regions are arranged to have a first step in a first direction from the memory cell region to the contact region while being substantially parallel to an upper surface of the substrate. The word line pad regions are arranged to have a second step, smaller than the first step, in a second direction, perpendicular to the first direction, while being parallel to the upper surface of the substrate. Among the word lines, word lines located at different heights extend to have different lengths in the first direction from the memory cell region. The upper gate lines include upper pad regions arranged to have a third step, smaller than the first step in the first direction and arranged to have the same height in the second direction.

A semiconductor device according to an exemplary embodiment of the present inventive concept includes a first gate group including first gate electrodes extending in a first direction and sequentially stacked. A second gate group is disposed on the first gate group, and includes second gate electrodes extending in the first direction and sequentially stacked. The first gate electrodes include a first lower electrode and a first upper electrode above the first lower electrode. The second gate electrodes include a second lower electrode and a second upper electrode above the second lower electrode. The first lower electrode extends by a first length, further than the first upper electrode, in the first direction. The second lower electrode extends by a second length, different from the first length, further than the second upper electrode, in the first direction.

BRIEF DESCRIPTION OF DRAWINGS

The above and other features of the inventive concept will become more apparent by describing in detail exemplary embodiments thereof, with reference to the accompanying drawing, in which:

FIGS. 13A, 13B, 14A, 14B, 15A, 15B, 16A, 16B, 17, 18A, 18B, 18C, 18D, 19A, 19B, 20A, 20B, 21A, 21B, 22, 23A and 23B are cross-sectional views illustrating an example of a method of manufacturing a semiconductor device according to an exemplary embodiment of the present inventive concept.

DETAILED DESCRIPTION

Figure 1:
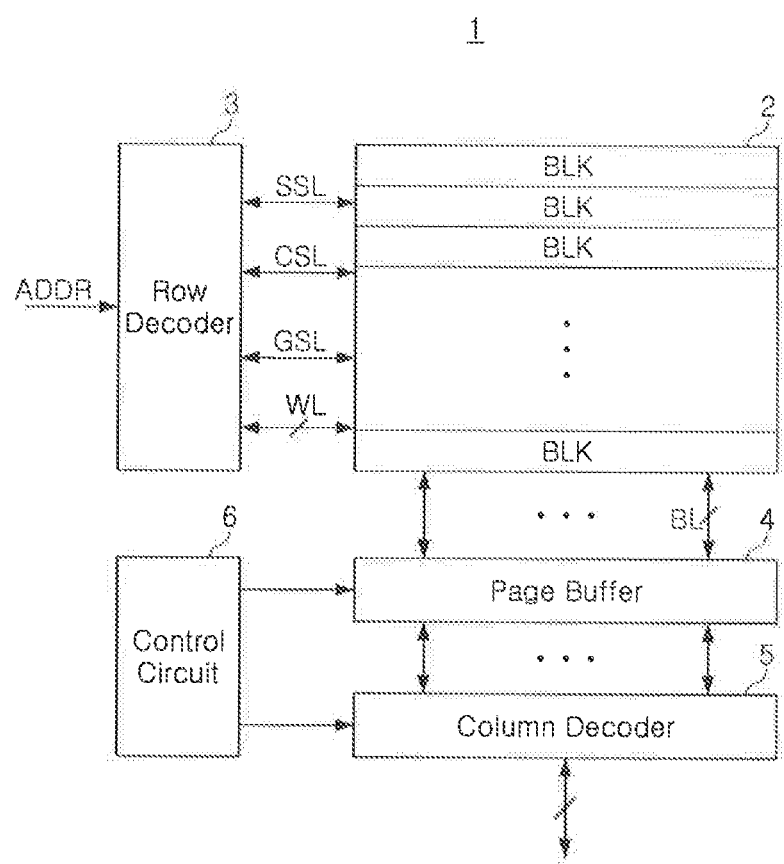
FIG. 1 is a schematic block diagram of a semiconductor device according to an exemplary embodiment of the present inventive concept.

An example of a semiconductor device according to an exemplary embodiment of the present inventive concept will be described in more detail below with reference to FIG. 1. FIG. 1 is a schematic block diagram of a semiconductor device according to an exemplary embodiment of the present inventive concept.

With reference to FIG. 1, a semiconductor device 1 may include a memory cell array 2, a row decoder 3, a page buffer 4, a column decoder 5, and a control circuit 6. The memory cell array 2 may include a plurality of memory blocks BLK.

The memory cell array 2 may include a plurality of memory cells arranged in a plurality of rows and columns. The plurality of memory cells included in the memory cell array 2 may be electrically connected to the row decoder 3 through a plurality of word lines WL, at least one common source line CSL, a plurality of string select lines SSL, and at least one ground select line GSL, and may be electrically connected to the page buffer 4 and the column decoder 5 through a plurality of bit lines BL.

In an exemplary embodiment of the present inventive concept, a plurality of memory cells arranged linearly in a single row may be connected to the same word line WL, and a plurality of memory cells arranged linearly in a single column may be connected to the same bit line BL.

The row decoder 3 may be commonly connected to the plurality of memory blocks BLK, and may provide a driving signal to the word lines WL of memory blocks BLK selected in response to a block selection signal. For example, the row decoder 3 may receive externally provided address information ADDR, and may decode the received address information ADDR to determine a voltage to be supplied to at least a portion of the word line WL, the common source line CSL, the plurality of string select lines SSL or the ground select line GSL, electrically connected to the memory cell array 2.

The page buffer 4 may be electrically connected to the memory cell array 2 through the bit lines BL. The page buffer 4 may be connected to the bit line BL selected according to an address decoded by the column decoder 5. The page buffer 4 may temporarily store data to be stored in the memory cells or may sense data stored in the memory cells, according to an operation mode. For example, the page buffer 4 may operate as a write driving circuit in a program operation mode, and may operate as a sense amplifier circuit in a read operation mode. The page buffer 4 may receive power, for example, a voltage or a current, from a control logic, and may provide the received power to the selected bit line BL.

The column decoder 5 may provide a data transmission path between the page buffer 4 and an external device, for example, a memory controller. The column decoder 5 may decode an externally input address to select any one of the bit lines BL. The column decoder 5 may be commonly connected to the memory blocks BLK, and may provide data information to the bit lines BL of the memory block BLK selected in response to a block selection signal.

The control circuit 6 may control overall operations of the semiconductor device 1. The control circuit 6 may receive a control signal and an external voltage, and may operate in response to the received control signal. The control circuit 6 may include a voltage generator generating voltages required for internal operations, for example, a program voltage, a read voltage, or an erase voltage, using an external voltage. The control circuit 6 may control the reading, writing, and/or erasing operations in response to control signals.

An example of a circuit of the memory cell array 2 (see, e.g., FIG. 1) of the semiconductor device 1 (see, e.g., FIG. 1), described with reference to FIG. 1, will be described in more detail below with reference to FIG. 2.

Figure 2:
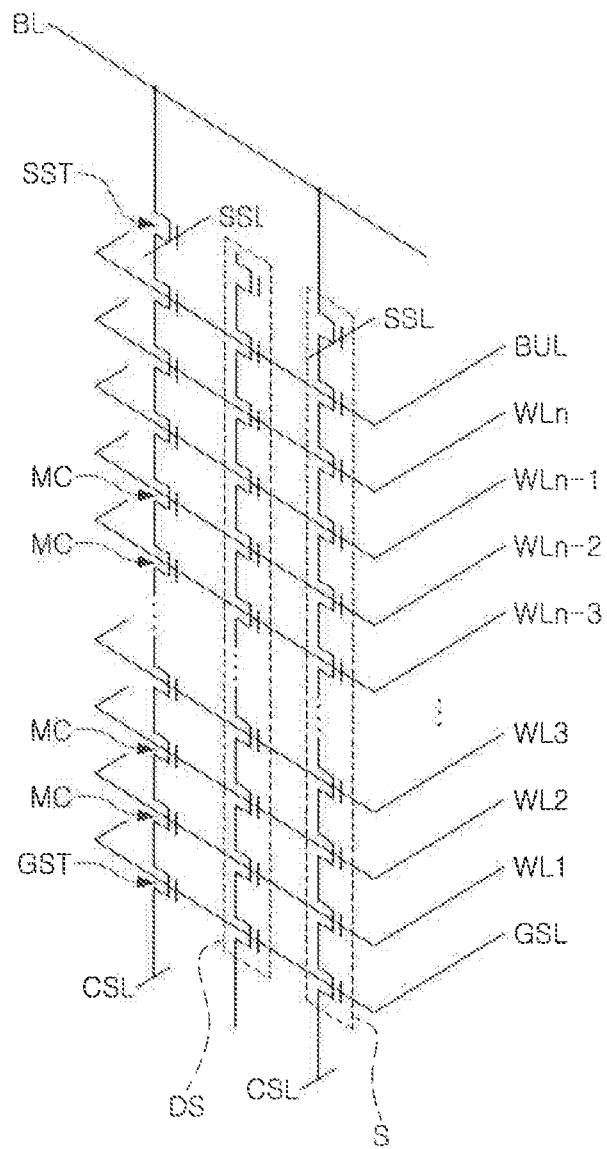
FIG. 2 is a conceptual circuit diagram illustrating a memory cell array of a semiconductor device according to an exemplary embodiment of the present inventive concept.

FIG. 2 is a conceptual circuit diagram illustrating a memory cell array of a semiconductor device according to an exemplary embodiment of the present inventive concept.

With reference to FIG. 2, the memory cell array 2 (see, e.g., FIG. 1) may include a plurality of memory cell strings S including memory cells MC connected to each other in series, a ground select transistor GST and a string select transistor SST connected to opposite ends of the memory cells MC1 to MCn in series, respectively. The memory cells MC connected to each other in series may be connected to word lines WL1 to WLn to select the memory cells MC, respectively. In an example, the plurality of word lines WL1 to WLn may be provided as n number of word lines.

A gate terminal of the ground select transistor GST may be connected to the ground select line GSL, and a source terminal thereof may be connected to the common source line CSL. A gate terminal of the string select transistor SST may be connected to the string select line SSL, and a source terminal thereof may be connected to drain terminals of the memory cells MC. Although FIG. 2 illustrates a structure in which one ground select transistor GST and one string select transistor SST are respectively connected to a plurality of memory cells MC connected to one another in series; however, exemplary embodiments of the present inventive concept are not limited thereto. For example, in a manner different therefrom, a plurality of ground select transistors GST or a plurality of string select transistors SST may also be connected thereto.

In an exemplary embodiment of the present inventive concept, a dummy line or a buffer line BUL may be disposed between an uppermost word line WLn among the word lines WL1 to WLn and the string select line SSL.

A drain terminal of the string select transistor SST may be connected to a bit line BL. For example, when a signal is applied to a gate terminal of the string select transistor SST through the string select line SSL, a signal applied through the bit line BL may be transmitted to the memory cells MC connected to each other in series, thus performing reading and writing operations. As a predetermined erase voltage is applied through a substrate, an erasing operation of erasing data written to the memory cells MC may be performed.

A semiconductor device according to an exemplary embodiment of the present inventive concept may include at least one dummy string DS. The dummy string DS may be a string including a dummy channel electrically isolated from the bit line BL.

Memory cells of a memory cell array that may be disposed on a memory cell region of a substrate according to an exemplary embodiment of the present inventive concept will be described in more detail below with reference to FIGS. 3, 4, 5 and 6. Pad regions of gate electrodes that may be disposed on a contact region of a substrate according to an exemplary embodiment of the present inventive concept will be described in more detail below with reference to FIG. 3 and FIGS. 7A, 7B, 8A, 8B, 9A, 9B and 10 to 12. The memory cell region may be a region in which the memory cells MC (see, e.g., FIG. 2) of the memory cell array are disposed, and the contact region may be a region in which pad regions of gate electrodes in direct contact with contact plugs to apply an electrical signal or a voltage to the string select lines SSL, the word lines WL and/or the ground select line GSL are disposed.

Figure 3:
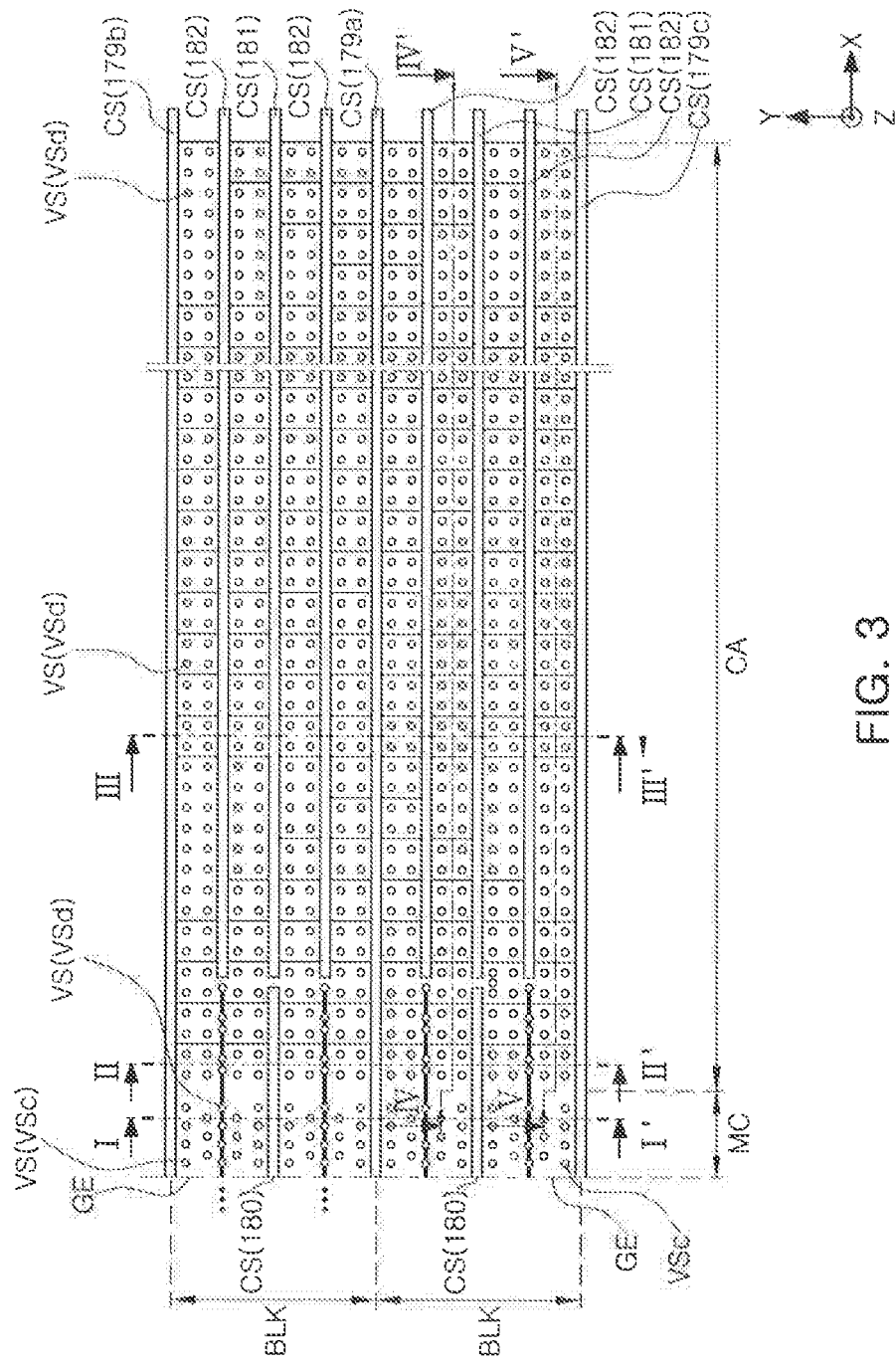
FIG. 3 is a schematic plan view illustrating an example of a semiconductor device according to an exemplary embodiment of the present inventive concept.
Figure 4:
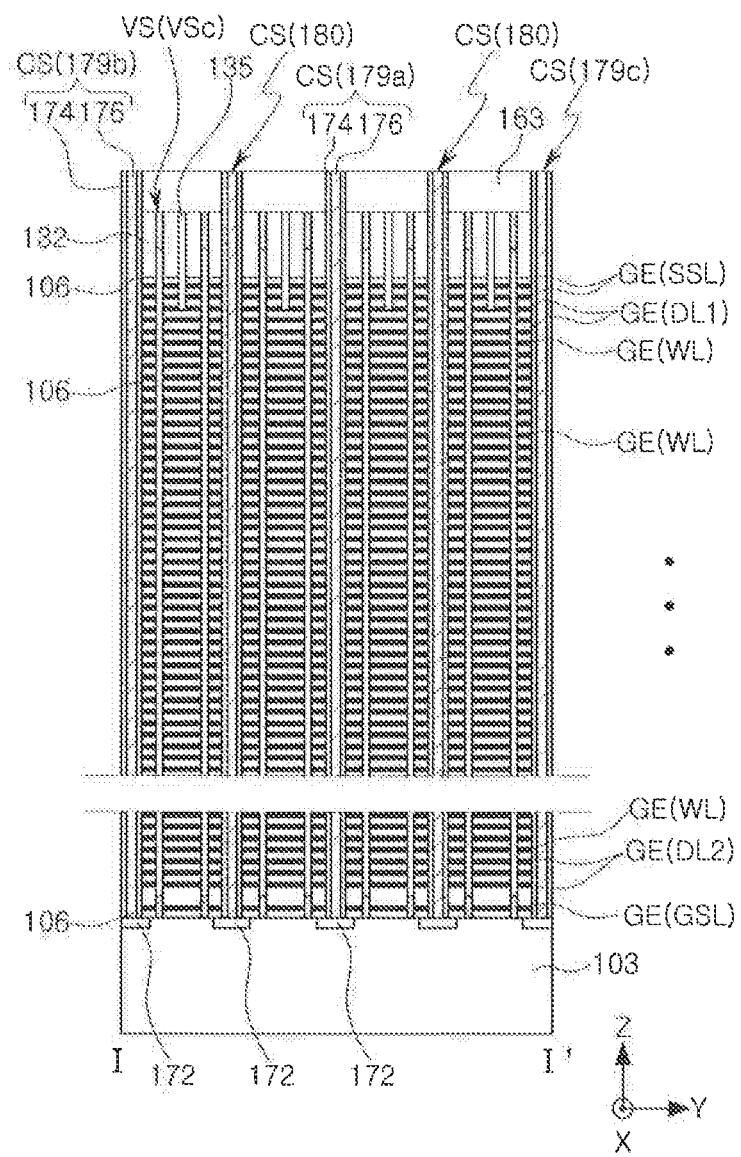
FIG. 4 is a cross-sectional view illustrating an example of a semiconductor device according to an exemplary embodiment of the present inventive concept.
Figure 5:
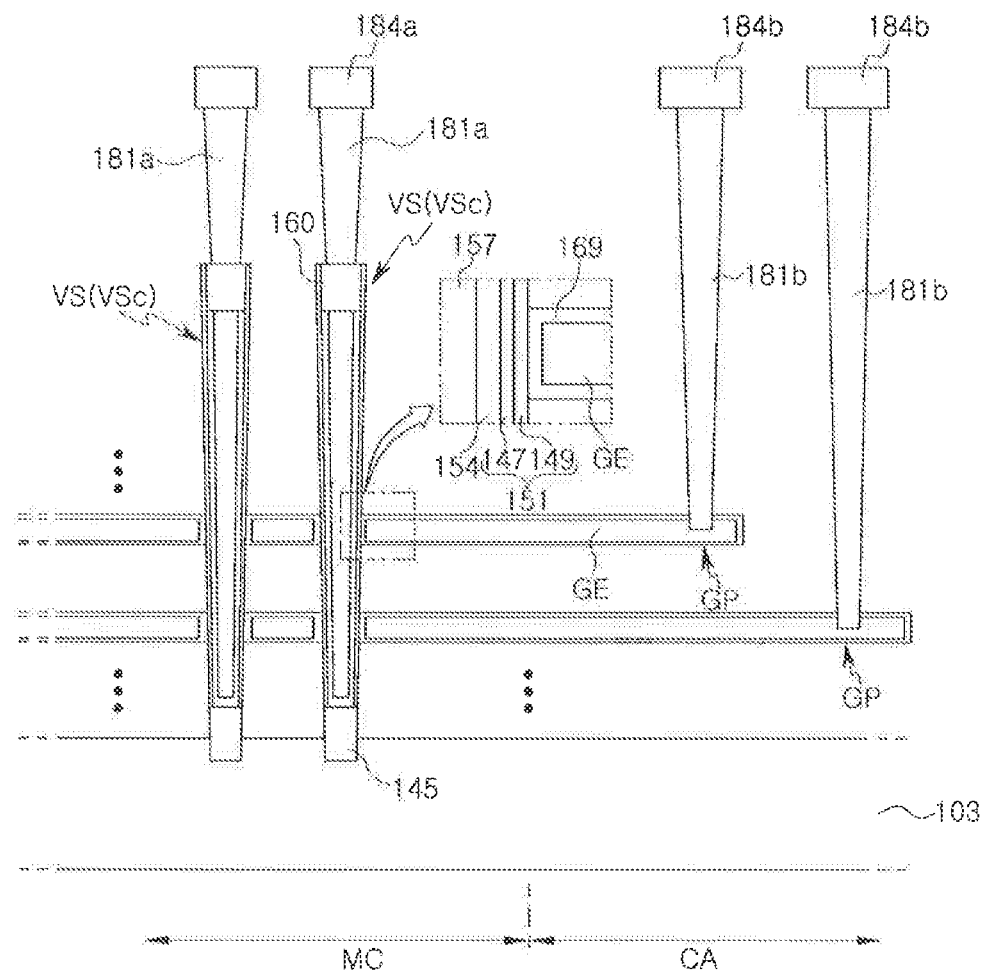
FIG. 5 is a longitudinal cross-sectional view schematically illustrating a portion of a semiconductor device according to an exemplary embodiment of the present inventive concept.
Figure 6:
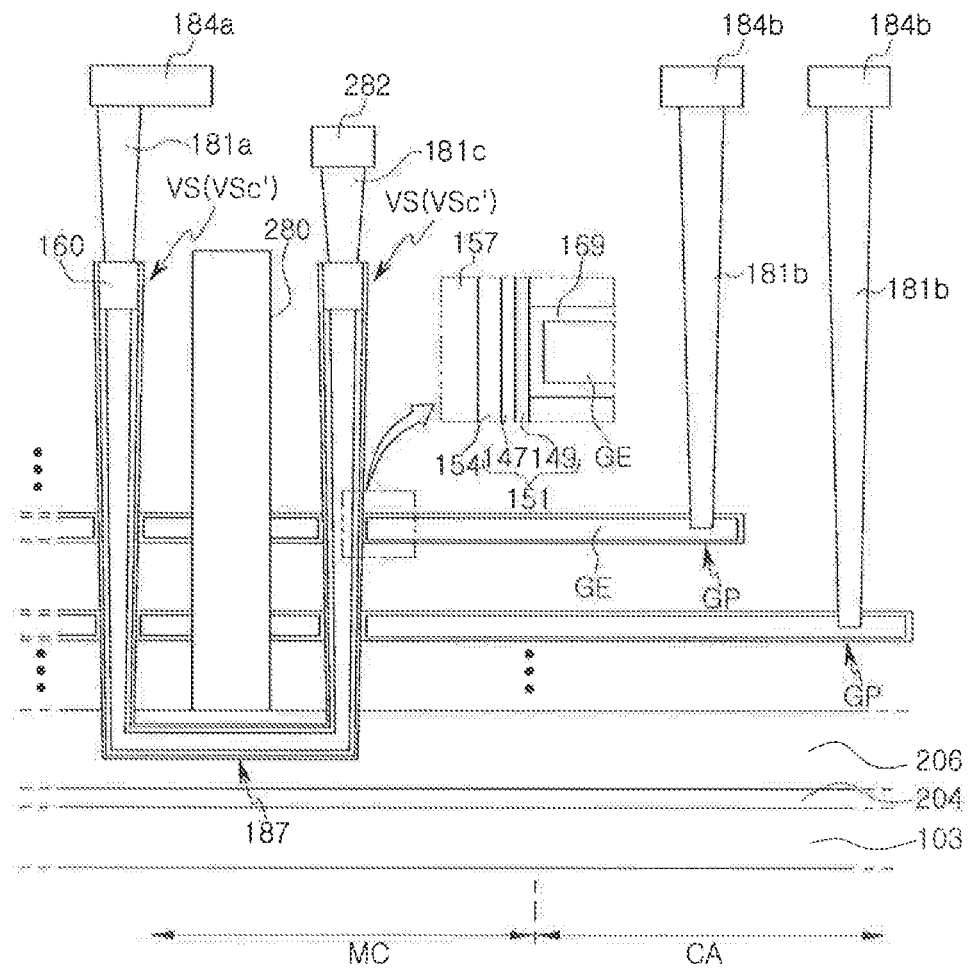
FIG. 6 is a longitudinal cross-sectional view schematically illustrating a portion of a modified example of the semiconductor device of FIG. 5.

FIG. 3 is a schematic plan view illustrating an example of a semiconductor device according to an exemplary embodiment of the present inventive concept. FIG. 4 is a cross-sectional view illustrating an example of a semiconductor device according to an exemplary embodiment of the present inventive concept. FIG. 5 is a longitudinal cross-sectional view schematically illustrating a portion of a semiconductor device according to an exemplary embodiment of the present inventive concept. FIG. 6 is a longitudinal cross-sectional view schematically illustrating a portion of a modified example of the semiconductor device of FIG. 5.

An exemplary embodiment of the present inventive concept will be described in more detail below with reference to FIG. 4 together with FIG. 3.

With reference to FIGS. 3 and 4, gate electrodes GE may be disposed on a memory cell region MC of a substrate 103. The substrate 103 may be a semiconductor substrate. The gate electrodes GE may be sequentially stacked on the substrate 103 while being spaced apart from each other in a direction Z perpendicular (e.g., orthogonal) to a surface of the substrate 103. The gate electrodes GE may be substantially parallel to an upper surface of the substrate 103. The gate electrodes GE may include a conductive material including at least one of doped polysilicon, a metal nitride such as TiN, a metal silicide such as WSi, TiSi, or TaSi, or a metal. The doped polysilicon may be conductive polysilicon including an N-type impurity such as P, or As, or a P-type impurity such as B.

The gate electrodes GE may include the string select lines SSL described with reference to FIGS. 1 and 2. For example, an uppermost gate electrode and a next upper gate electrode below the uppermost gate electrode among the gate electrodes GE may be included in the string select lines SSL.

The gate electrodes GE may include the ground select line GSL described with reference to FIGS. 1 and 2. For example, a lowermost gate electrode among the gate electrodes GE may be included in the ground select line GSL.

The gate electrodes GE may include the word lines WL described with reference to FIGS. 1 and 2. For example, among the gate electrodes GE, a plurality of gate electrodes positioned between the ground select line GSL and the string select lines SSL may be included in the word lines WL.

In an exemplary embodiment of the present inventive concept, among the gate electrodes GE, one or more gate electrodes located between an uppermost word line WL and the string select lines SSL may be buffer gate electrodes or upper dummy gate electrodes DL1. A floating dummy gate electrode DL3 (see, e.g., FIG. 8A) may be disposed above the upper dummy gate electrode DL1 located in a contact region CA. Among the gate electrodes GE, one or more gate electrodes positioned between a lowermost word line WL and the ground select line GSL may be lower dummy gate electrodes DL2.

Source structures CS may be disposed on the memory cell region MC of the substrate 103.

Each of the source structures CS may include a source pattern 176 and a spacer 174 disposed on a side of the source pattern 176. The spacer 174 may substantially cover a side of the source pattern 176. The spacer 174 may include an insulating material such as silicon oxide, or silicon nitride.

The source pattern 176 may include a conductive material including at least one of doped polysilicon, or a metal nitride such as titanium nitride, or a metal such as tungsten.

The source structures CS may include main source structures 179a, 179b and 179c, and first secondary source structures 180. The first secondary source structures 180 may be disposed between adjacent main source structures of the main source structures 179a, 179b and 179c. The main source structures 179a, 179b and 179c and the first secondary source structures 180 may extend in a direction Z perpendicular (e.g., orthogonal) to the upper surface of the substrate 103, while penetrating through the gate electrodes GE. The main source structures 179a, 179b and 179c and the first secondary source structures 180 may have a linear shape extending in a first direction X, parallel to the upper surface of the substrate 103. The gate electrodes GE may extend in the first direction X, parallel to the upper surface of the substrate 103. Thus, the gate electrodes GE may be disposed between the main source structures 179a, 179b and 179c and the first secondary source structures 180.

Source regions 172 may be disposed in the substrate 103 below the main source structures 179a, 179b and 179c and the first secondary source structures 180. The source regions 172 may have N-type conductivity, and portions of the substrate 103 adjacent to the source regions 172 may have P-type conductivity.

An insulating pattern 135 may be disposed in such a manner that the insulating pattern 135 penetrates through the string select lines SSL while being positioned above the word lines WL. The insulating pattern 135 may be disposed between the main source structures 179a, 179b and 179c and the first secondary source structures 180. The insulating pattern 135 may have a linear shape extending in the first direction X. The insulating pattern 135 may include a silicon oxide.

On a plane, the string select lines SSL may be spaced apart from each other by the main source structures 179a, 179b and 179c, the first secondary source structures 180, and the insulating pattern 135.

Vertical structures VS may be disposed, in such a manner that the vertical structures VS extend in a direction Z perpendicular to the upper surface of the substrate 103, while penetrating through the gate electrodes GE. The vertical structures VS may include vertical cell structures VSc. For example, the vertical cell structures VSc may penetrate through the string select lines SSL, the word lines WL, and the ground select line GSL.

An exemplary embodiment of the present inventive concept will be described in more detail below with reference to FIG. 5. FIG. 5 is a longitudinal cross-sectional view schematically illustrating a connection wiring structure of the gate electrodes GE, and the bit lines BL described with reference to FIGS. 1 and 2, with a more detailed structure of the vertical cell structures VSc, the first secondary source structures 180 and the main source structures 179a, 179b and 179c.

With reference to FIG. 5 with FIGS. 1 to 4, each of the vertical cell structures VSc may include a semiconductor pattern 145, a core pattern 157, a pad pattern 160, a channel semiconductor layer 154, and a first gate dielectric 151. A second gate dielectric 169 may be positioned in such a manner that the second gate dielectric 169 is disposed on upper and lower surfaces of the gate electrodes GE while extending between the vertical cell structures VSc and the gate electrodes GE.

The semiconductor pattern 145 may be in direct contact with the substrate 103. For example, the semiconductor pattern 145 may penetrate an upper portion of the substrate 103. In an example, the semiconductor pattern 145 may be an epitaxial material layer that may be formed by a selective epitaxial growth (SEG) process. For example, the semiconductor pattern 145 may include monocrystalline silicon.

The core pattern 157 may be disposed on the semiconductor pattern 145, and may include an insulating material, for example, silicon oxide. Thus, the core pattern 157 may be in direct contact with the semiconductor pattern 145. The pad pattern 160 may be disposed on the core pattern 157. Thus, the pad portion 160 may be in direct contact with the core pattern 157. The pad pattern 160 may include polysilicon having N-type conductivity, and may be provided as a drain region. The pad pattern 160 may be disposed to be higher than a level of the gate electrodes GE.

The channel semiconductor layer 154 may be in direct contact with the semiconductor pattern 145 while extending in a vertical direction Z. The channel semiconductor layer 154 may substantially cover a side of the core pattern 157, and may be in direct contact with the pad pattern 160. The channel semiconductor layer 154 may penetrate through the word lines WL and the string select lines SSL of the gate electrodes GE. The channel semiconductor layer 154 may be referred to as a channel layer or a semiconductor layer. The channel semiconductor layer 154 may include a polysilicon layer.

The first gate dielectric 151 may be disposed between the channel semiconductor layer 154 and the gate electrodes GE, while substantially covering an outer side of the channel semiconductor layer 154 facing the gate electrodes GE.

One of the first and second gate dielectrics 151 and 169 may include a layer in which data may be stored. For example, the first gate dielectric 151 may include a layer capable of storing data, but exemplary embodiments of the present inventive concept are not limited thereto. For example, the second gate dielectric 169 may include a layer capable of storing data. An exemplary embodiment of the present inventive concept in which the first gate dielectric 151 includes a layer capable of storing data will be described in more detail below.

The first gate dielectric 151 may include a tunnel dielectric layer 147 and a data storage layer 149. In the first gate dielectric 151, the tunnel dielectric layer 147 may be disposed to be closer to the channel semiconductor layer 154 than to the data storage layer 149. The tunnel dielectric layer 147 may be disposed between the data storage layer 149 and the channel semiconductor layer 154.

The tunnel dielectric layer 147 may include a silicon oxide and/or an impurity-doped silicon oxide. The data storage layer 149 may be a layer in which data is to be stored in a nonvolatile memory device such as a flash memory device. For example, the data storage layer 149 may include a material, for example, silicon nitride, capable of trapping and retaining electrons injected from the channel semiconductor layer 154 through the tunnel dielectric layer 147, or of removing the trapped electrons within the data storage layer 149, depending on operating conditions of the nonvolatile memory device such as a flash memory device. The second gate dielectric 169 may be a blocking dielectric. The second gate dielectric 169 may include a high dielectric material, for example, AlO.

The data storage layer 149 may store data in regions thereof opposite the word lines WL. In the data storage layer 149 within one of the vertical cell structures VSc, regions thereof in which data may be stored may be arranged in the vertical direction Z, and may be defined as the memory cells MC (see, e.g., FIG. 2).

First conductive lines 184a may be disposed on the vertical cell structures VSc. The first conductive lines 184a may be the bit lines BL (see, e.g., FIG. 2) described with reference to FIGS. 1 and 2. Bit line contact structures 181a may be disposed between the first conductive lines 184a and the vertical cell structures VSc. The bit line contact structures 181a may electrically connect the first conductive lines 184a and the vertical cell structures VSc to each other.

The gate electrodes GE may extend from the memory cell region MC of the substrate 103 to the contact region CA of the substrate 103. The gate electrodes GE may include pad regions GP located in the contact region CA. Contact plugs 181b may be disposed on the pad regions GP. Gate wirings 184b may be disposed on the contact plugs 181b.

The vertical cell structures VSc may be spaced apart from each other, but exemplary embodiments of the present inventive concept are not limited thereto. For example, vertical cell structures may be positioned in such a manner that lower portions of the vertical cell structures are connected to each other by connection portions connecting the lower portions of the vertical cell structures to each other. Thus, the vertical cell structures, of which lower portions are connected to each other, according to an exemplary embodiment of the present inventive concept will be described in more detail below with reference to FIG. 6.

Referring to FIG. 6, vertical cell structures VSc' may be connected to each other by a connection portion 187. The vertical cell structures VSc' may penetrate through the gate electrodes GE, and the connection portion 187 may connect lower portions of the vertical cell structures VSc' to each other.

Each of the vertical cell structures VSc' may include the channel semiconductor layer 154 penetrating through the gate electrodes GE, the core pattern 157 surrounded by the channel semiconductor layer 154, the pad pattern 160 on the channel semiconductor layer 154, and the first gate dielectric 151 surrounding an outer side of the channel semiconductor layer 154 while being disposed between the channel semiconductor layer 154 and the gate electrodes GE. The connection portion 187 may be formed by continuously extending the channel semiconductor layer 154, the core pattern 157 and the first gate dielectric 151 provided in the vertical cell structures VSc.

The connection portion 187 may be disposed in a lower gate 206 located between the substrate 103 and the gate electrodes GE. A base insulating layer 204 may be disposed between the lower gate 206 and the substrate 103. One of the vertical cell structures VSc' connected to each other by the connection portion 187 may be electrically connected to a source line 282 by a source contact plug 181c, and the other thereof may be electrically connected to the first conductive line 184a which may serve as a bit line by the bit line contact structures 181a. A separation pattern 280 penetrating through the gate electrodes GE may be disposed on the connection portion 187 between the vertical cell structures VSc'.

Pad regions of gate electrodes that may be disposed on the contact region CA of the substrate 103 will be described in more detail below with reference to FIGS. 7A, 7B, 8A and 8B in conjunction with FIG. 3.

Figure 7A:
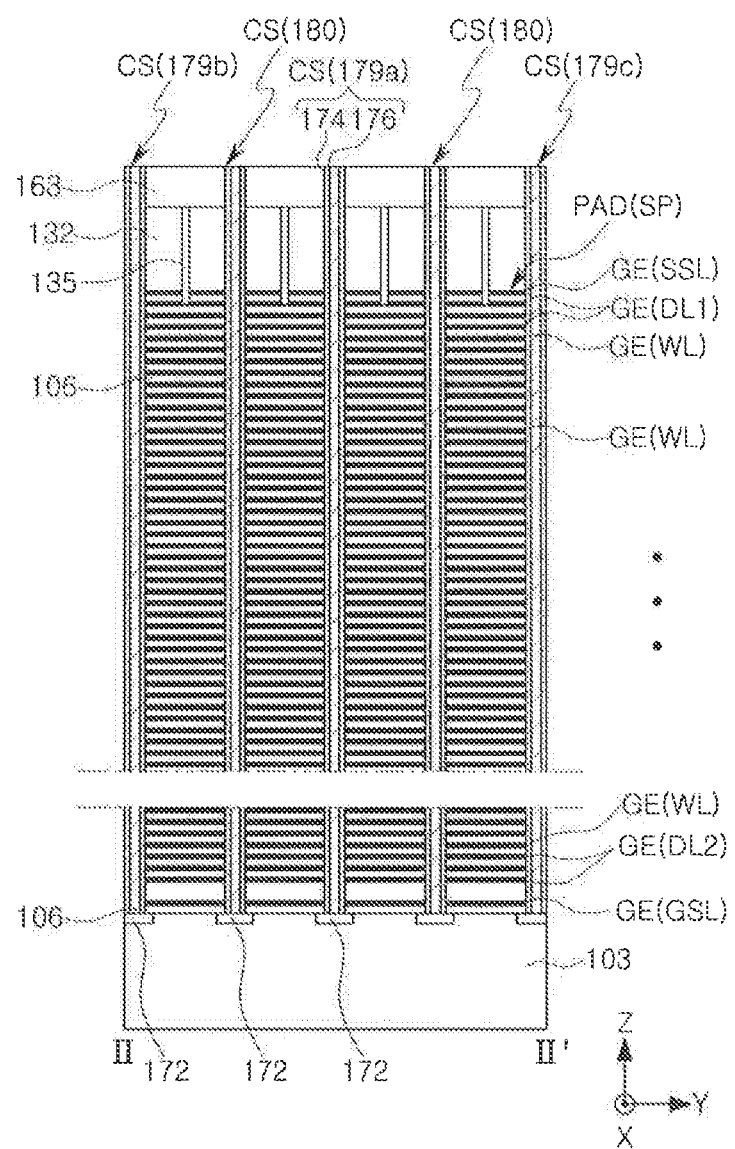
FIGS. 7A, 7B, 8A and 8B are cross-sectional views illustrating examples of a semiconductor device according to an exemplary embodiment of the present inventive concept.
Figure 7B:
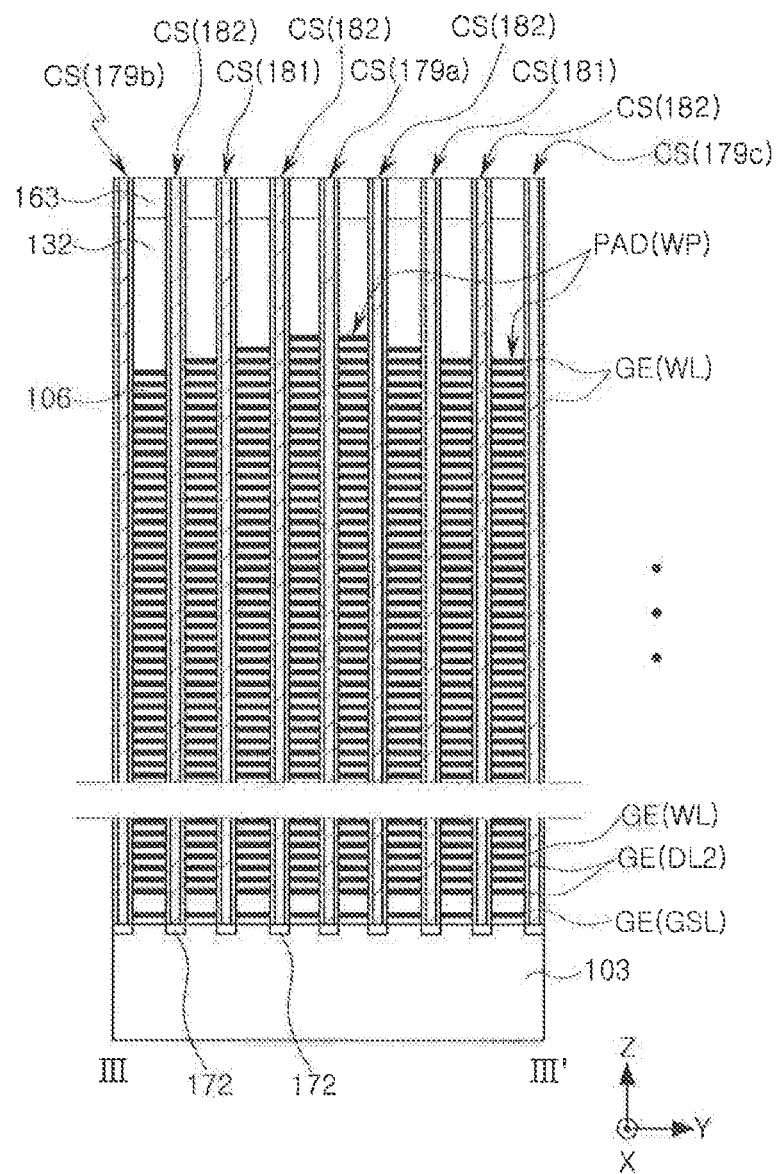
Figure 8A:
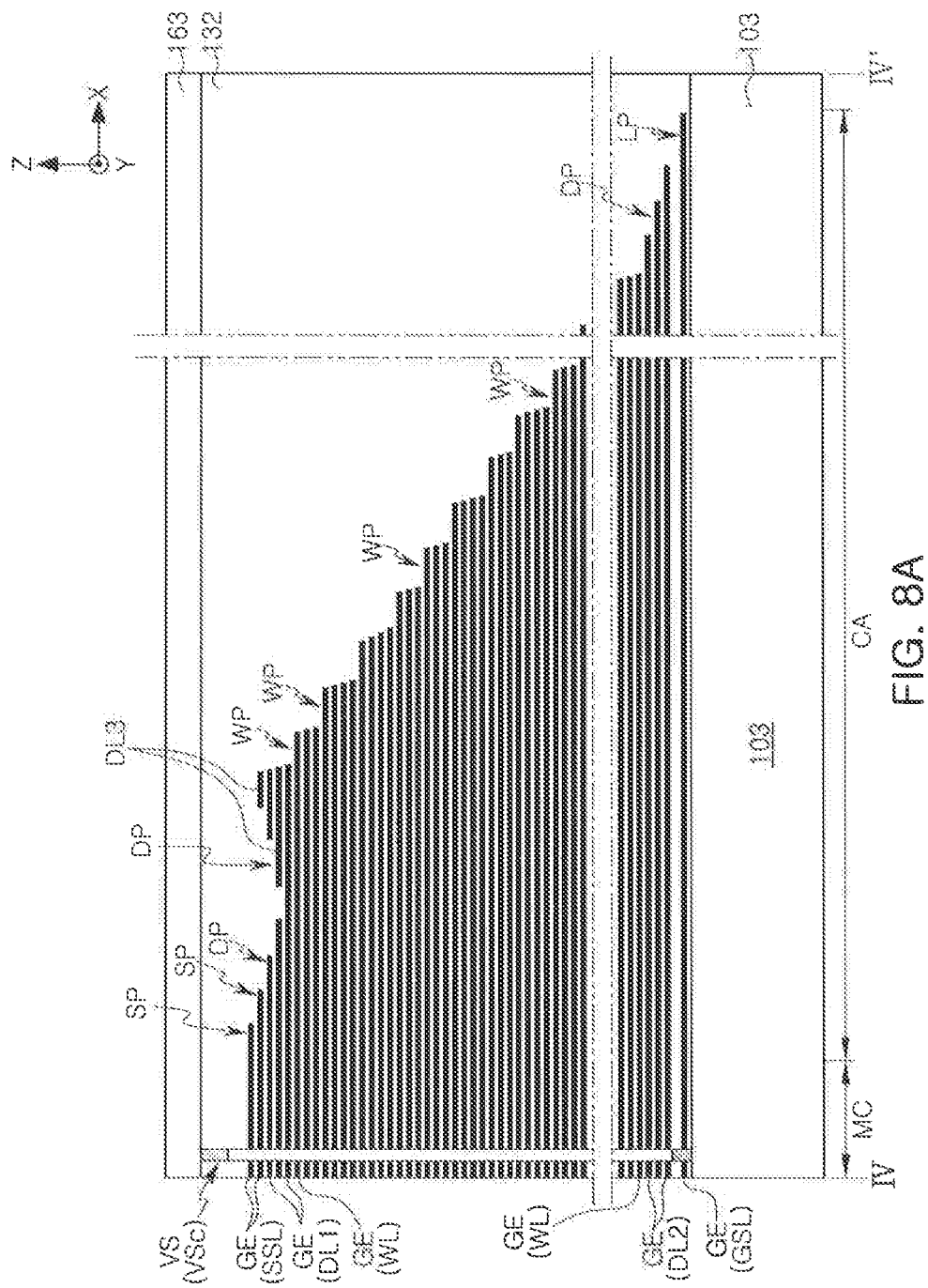
Figure 8B:
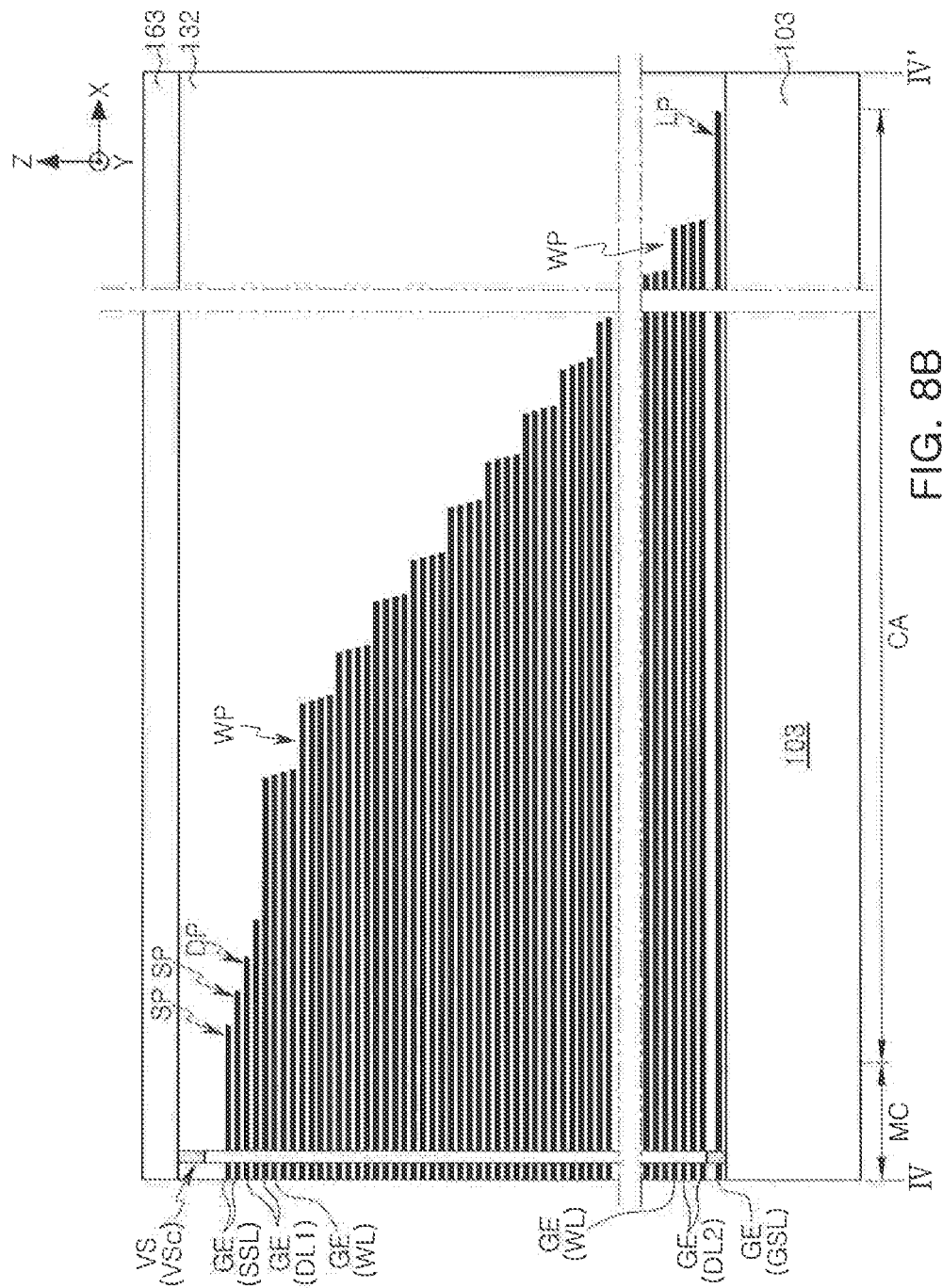

FIGS. 7A, 7B, 8A and 8B are cross-sectional views illustrating examples of a semiconductor device according to an exemplary embodiment of the present inventive concept FIG. 7A is a cross-sectional view illustrating a region taken along line II-II' of FIG. 3, FIG. 7B is a cross-sectional view illustrating a region taken along line III-III' of FIG. 3, FIG. 8A is a cross-sectional view taken along line IV-IV' of FIG. 3, and FIG. 8B is a cross-sectional view illustrating a region taken along line V-V' of FIG. 3.

Referring to FIGS. 3, 7A, 7B, 8A and 8B, the gate electrodes GE, the first secondary source structures 180, the main source structures 179a, 179b and 179c, and the vertical cell structures VSc may be disposed on the memory cell region MC of the substrate 103 (see, e.g., FIGS. 3 and 4). The substrate 103 may include the memory cell region MC and the contact region CA. The contact region CA may be adjacent to the memory cell region MC.

In an exemplary embodiment of the present inventive concept, the memory cell region MC may be referred to as a first region, and the contact region CA may be referred to as a second region or an extended region.

The gate electrodes GE disposed on the memory cell region MC of the substrate 103 may extend in the first direction X parallel to an upper surface of the substrate 103 to extend onto the contact region CA of the substrate 103. The first direction X may be a direction from the memory cell region MC to the contact region CA.

The gate electrodes GE may be formed in such a manner that ends thereof are located in the contact region CA. The gate electrodes GE disposed at different heights above the upper surface of the substrate 103 or on different positional levels may have different lengths extending into the contact region CA from the memory cell region MC. The word lines WL disposed at different heights or on different positional levels may have different lengths extending into the contact region CA from the memory cell region MC. In the case of the gate electrodes GE, the word lines WL thereof may extend in the first direction X from the memory cell region MC to be longer than the string select lines SSL, the ground select line GSL may extend in the first direction X from the memory cell region MC to be longer than the word lines WL.

The main source structures 179a, 179b and 179c may extend in the first direction X from the memory cell region MC to the contact region CA to traverse the contact region CA. The first secondary source structures 180 may extend from the memory cell region MC to extend between the string select lines SSL in the contact region CA.

Second secondary source structures 181 having ends opposing the first secondary source structures 180 may be disposed on the contact region CA of the substrate 103. For example, ends of the second secondary source structures 181 may be spaced apart from ends of the first second source structures 180 (see, e.g., FIG. 3). The first and second secondary source structures 180 and 181 may be spaced apart from each other, while having ends adjacent to each other (see, e.g., FIG. 3). The second secondary source structures 181 may have a linear shape extending in the first direction X in the contact region CA. Third secondary source structures 182 may be disposed between the second secondary source structures 181 and the main source structures 179a, 179b and 179c on the contact region CA of the substrate 103. The second secondary source structures 181 and third secondary source structures 182 may be formed to have substantially the same structure as those of the main source structures 179a, 179b and 179c and the first secondary source structures 180. The main source structures 179a, 179b and 179c may include first to third main source structures 179a, 179b and 179c. The first main source structure 179a may be disposed between the second and third main source structures 179b and 179c.

The gate electrodes GE may include pad regions (see, e.g., pad regions GP in FIG. 5) located on the contact region CA of the substrate 103. The pad regions may be arranged in a mirror symmetrical structure along the Y direction with respect to the first main source structure 179a (see, e.g., FIG. 7B). For example, an array of pad regions GP disposed between the first main source structure 179a and the second main source structure 179b may have a mirror symmetrical structure with respect to an array of pad regions between the first main source structure 179a and the third main source structure 179c.

In the case of the gate electrodes GE, the string select lines SSL thereof may have string select pad regions SP, the word lines WL thereof may have word line pad regions WP, and the ground select line thereof GSL may have a ground select pad region LP. In an exemplary embodiment of the present inventive concept, the dummy gate electrodes DL1 and DL2 may have dummy gate pad regions DP.

The word line pad regions WP may be closer to the memory cell region MC than to the ground select pad region LP, and the string select pad region SP may be closer to the memory cell region MC than to the word line pad region WP.

In an exemplary embodiment of the present inventive concept, in the case of the gate electrodes GE, string select lines SSL thereof including next-highest gate electrodes (e.g., gate electrodes below uppermost gate electrodes) may extend by a length substantially equal to that of the string select pad regions SP, further than highest string select lines SSL including the uppermost gate electrodes. The length of the string select pad regions SP may refer to a length of the string select pad regions SP in the first direction X.

The string select pad regions SP arranged in a second direction Y perpendicular to the first direction X and parallel to the upper surface of the substrate 103 may be located on the same positional level as each other above the upper surface of the substrate 103. For example, the string select pad regions SP may be located at the same height from the upper surface of the substrate 103.

In an exemplary embodiment of the present inventive concept, the string select pad regions SP arranged in the first direction X may be arranged in a stepped manner lowered to have a predetermined step, and the string select pad regions SP arranged in the second direction Y may be arranged to have the same height. In this case, a step between the string select pad regions SP may correspond to a distance between an upper surface of a next highest gate electrode and an upper surface of an uppermost gate electrode.

The word line pad regions WP may have a stepped shape lowered to have a second step in a positive direction of the second direction Y and in a negative direction of the second direction Y with respect to the first main source structure 179a. For example, the word line pad regions WP may be arranged to have a stepped shape lowered to have the second step in a direction from the first main source structure 179a to the second main source structure 179b, and may be arranged to have a stepped shape lowered to have the second step in a direction from the first main source structure 179a to the third main source structure 179c. Thus, the word line pad regions WP may be arranged in a mirror symmetric structure with respect to the first main source structure 179a.

In an exemplary embodiment of the present inventive concept, the second step may be a distance from an upper surface of one of two word lines adjacent to each other in a vertical direction to an upper surface of the other word line.

The word line pad regions WP may be arranged in a stepwise manner, in which the word line pad regions WP are stepped downwardly by the first step in the first direction X (see, e.g., FIGS. 8A and 8B). The first step may have a height difference between word lines having two word line pad regions, for example, a lower word line pad region and an upper word line pad region, adjacent to each other while being arranged in the first direction X. For example, the first step may refer to a height difference between an upper surface of the word line having the lower word line pad region and an upper surface of the word line having the upper word line pad region. A plurality of word lines may be disposed between the word line having the lower word line pad region and the word line having the upper word line pad region. For example, when the number of word line pad regions arranged in the second direction Y and arranged between the first main source structure 179a and the second main source structure 179b is n, the number of word lines disposed between the word line having the lower word line pad region and the word line having the upper word line pad region may be n−1, where n may be a natural number greater than three. For example, when the number of word line pad regions arranged in the second direction Y and arranged between the first main source structure 179a and the second main source structure 179b is 4, the number of word lines disposed between the word line having the lower word line pad region and the word line having the upper word line pad region may be 4−1, for example, three. The three word lines disposed between the word line having the lower word line pad region and the word line having the upper word line pad region may extend in the first direction X to have different lengths.

Thus, the word line pad regions WP may be arranged to have a first step in the first direction X from the memory cell region MC to the contact region CA while being parallel to the upper surface of the substrate 103, and may be arranged to have a second step, smaller than the first step, in the second direction Y perpendicular to the first direction X, while being parallel to the upper surface of the substrate 103.

In an exemplary embodiment of the present inventive concept, contact plugs may be disposed on the pad regions of the gate electrodes GE. The contact plugs may include string select contact plugs disposed on the string select pad regions, word line select contact plugs disposed on the word line pad regions, a ground select contact plug disposed on the ground select pad region, and dummy contact plugs disposed on the dummy gate pad regions. Contact plugs disposed on the pad regions of the gate electrodes GE may refer to the contact plugs 181b described in more detail above with reference, for example, to FIG. 5.

The word lines WL and the word line pad regions WP together with the contact plugs will be described in more detail below with reference to FIGS. 9A, 9B and 10 to 12. The word line pad regions WP arranged in the first direction X will be described in more detail below with reference to FIGS. 9A and 9B together with FIGS. 3-6, 7A, 7B, 8A and to 8B.

Figure 9A:
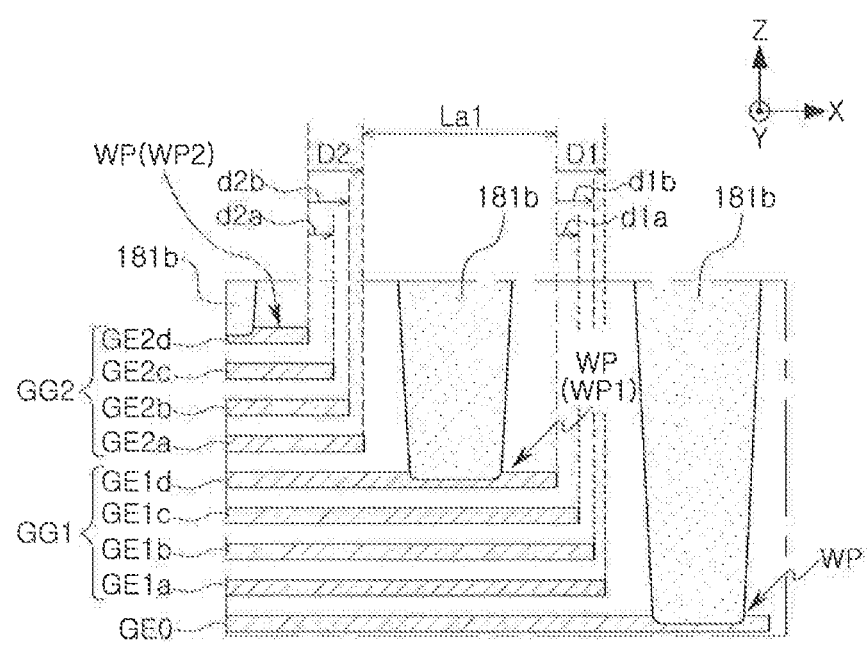
FIG. 9A is a partially enlarged view illustrating an example of a semiconductor device according to an exemplary embodiment of the present inventive concept.
Figure 9B:
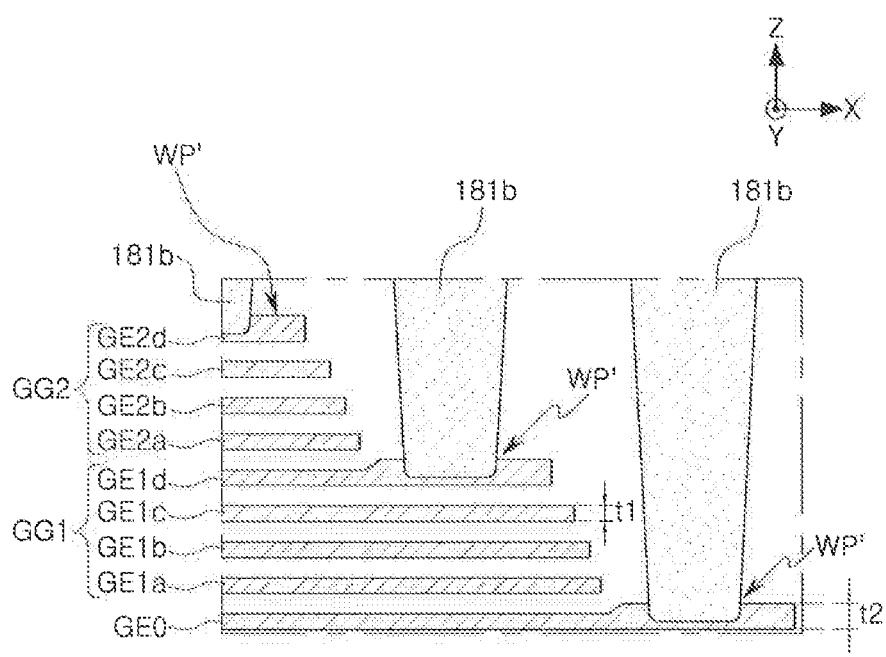
FIG. 9B is a partially enlarged view illustrating an example of a semiconductor device according to an exemplary embodiment of the present inventive concept.

FIG. 9A is a partially enlarged view illustrating an example of a semiconductor device according to an exemplary embodiment of the present inventive concept. FIG. 9B is a partially enlarged view illustrating an example of a semiconductor device according to an exemplary embodiment of the present inventive concept.

FIG. 9A is a partially enlarged view illustrating word line pad regions (see, e.g., FIG. 8A or FIG. 8B, and FIG. 9B) according to an exemplary embodiment of the present inventive concept.

Referring to FIG. 9A together with FIGS. 3-6, 7A, 7B, 8A and to 8B, the word lines WL may extend in the first direction X from the memory cell region MC to the contact region CA, and end portions of the word lines WL may be located in the contact region CA.

The word lines WL may include a first gate group GG1 and a second gate group GG2 above the first gate group GG1 (e.g., above the upper surface of the substrate 103).

The first gate group GG1 may be disposed above a gate electrode GE0 having a pad region WP, and may expose the pad region WP of the gate electrode GE0.

The first gate group GG1 may include first gate electrodes GE1a, GE1b, GE1c and GE1d. Among the first gate electrodes GE1a, GE1b, GE1c and GE1d of the first gate group GG1, relatively lower electrodes may extend relatively further in the first direction X. Thus, the first gate electrodes GE1a, GE1b, GE1c and GE1d of the first gate group GG1 may be arranged in such a manner that ends thereof are disposed to have a stepped shape. The first gate group GG1 may include the first gate electrodes GE1a, GE1b, GE1c and GE1d, for example, a first lower electrode GE1a, a first upper electrode GE1d disposed above the first lower electrode GE1a while including a first pad region WP1, and one or more first intermediate electrodes GE1b and GE1c disposed between the first lower electrode GE1a and the first upper electrode GE1d.

The second gate group GG2 may include second gate electrodes GE2a, GE2b, GE2c and GE2d. Among the second gate electrodes GE2a, GE2b, GE2c and GE2d of the second gate group GG2, relatively lower electrodes may extend relatively further in the first direction X. Thus, the second gate electrodes GE2a, GE2b, GE2c and GE2d of the second gate group GG2 may be arranged in such a manner that ends thereof are disposed to have a stepped shape. The second gate electrodes GE2a, GE2b, GE2c and GE2d of the second gate group GG2 may be sequentially stacked above the first upper electrode GE1d, to expose the first pad region WP1. The second gate group GG2 may include the second gate electrodes GE2a, GE2b, GE2c and GE2d, for example, a second lower electrode GE2a, a second upper electrode GE2d disposed on the second lower electrode GE2a while including a second pad region WP2, and one or more second intermediate electrodes GE2b and GE2c disposed between the second lower electrode GE2a and the second upper electrode GE2d.

In an exemplary embodiment of the present inventive concept, the first and second gate electrodes of the first and second gate groups GG1 and GG2 may be word lines.

In the first gate group GG1, the first lower electrode GE1a may be extended by a first length D1, further than the first upper electrode GE1d, in the first direction X. In the second gate group GG2, the second lower electrode GE2a may extend by a second length D2, different from the first length D1, further than the second upper electrode GE2d, in the first direction X.

In an example, the second length D2 may be greater than the first length D1.

In an example, respective lengths L of the first and second pad regions WP1 and WP2 may be greater than those of the first and second lengths D and D2, respectively.

The one or more first intermediate electrodes GE1b and GE1c may be arranged to extend by lengths d1b and d1a, respectively, further than the first upper electrode GE1D, in the first direction X, the lengths d1b and d1a each being less than the first length D1. The one or more second intermediate electrodes GE2b and GE2c may extend by lengths d2b and d2a, further than the second upper electrode GE2d, in the first direction X, the lengths d2b and d2a each being less than the second length D2. The one or more first intermediate electrodes (e.g., GE1b and GE1c) may include a plurality of electrodes. The one or more second intermediate electrodes (e.g., GE2b and GE2c) may include a plurality of electrodes.

Contact plugs 181b may be disposed on the word line pad regions WP including the first and second pad regions WP1 and WP2. The contact plugs 181b may include a conductive material including at least one of a metal nitride such as TiN, a metal silicide such as WSi, TiSi, or TaSi, or a metal such as tungsten (W). The contact plugs 181b may be in direct contact with the word line pad regions WP.

In an example, the word line pad regions WP including the first and second pad regions WP1 and WP2 may be formed to have the same thickness as a thickness of each of the word lines WL, but exemplary embodiments of the present inventive concept are not limited thereto. For example, referring to FIG. 9B, a thickness t2 of each of the word line pad regions WP may be greater than a thickness t1 of each of the word lines WL.

Referring to FIG. 9B, according to an alternative embodiment of the present inventive concept, a first gate electrode GE0 may be positioned above an upper surface of the substrate 103. The first gate electrode GE0 may include a first pad region WP' having a greater thickness along a direction orthogonal to the upper surface of the substrate 103 than a thickness of a portion of the first gate electrode GE0 spaced apart from the first pad region WP' along a direction parallel to the upper surface of the substrate 103. A first contact plug 181b may be in direct contact with the first pad region WP'. A first group of gate electrodes GGC1 may be positioned above the first gate electrode GE0. Ends of each gate electrode (e.g., GE1a, GE1b, GE1c and GE1d) of the first group of gate electrodes GG1 may form a stepped structure spaced apart from the first contact plug 181b along the direction parallel to the upper surface of the substrate 103. An uppermost gate electrode (GE1d) of the first group of gate electrodes GG1 may include a second pad region WP' having substantially a same thickness as the first pad region WP'. A second contact plug 181b may be in direct contact with the second pad region WP'. A second group of gate electrodes GG2 may be positioned above the first group of gate electrodes GG2. Ends of each gate electrode (e.g., GE1a, GE2b, GE2c and GE2d) of the second group of gate electrodes GG2 may form a stepped structure spaced apart from the second contact plug 181b along the direction parallel to the upper surface of the substrate 103.

An exemplary embodiment of the present inventive concept will be described in more detail below with reference to FIG. 10.

Figure 10:
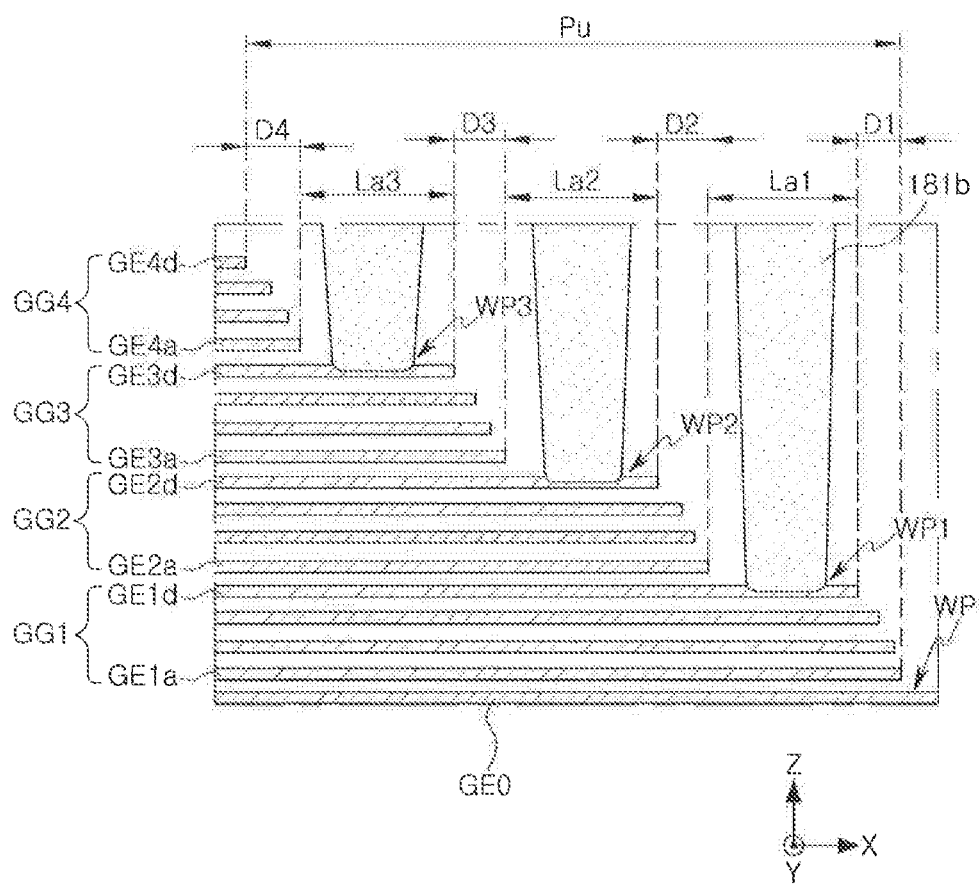
FIG. 10 is a partially enlarged view illustrating an example of a semiconductor device according to an exemplary embodiment of the present inventive concept.

FIG. 10 is a partially enlarged view illustrating an example of a semiconductor device according to an exemplary embodiment of the present inventive concept.

FIG. 10 illustrates word line pad regions WP (see, e.g., FIG. 8) of a semiconductor device according to an exemplary embodiment of the present inventive concept.

The word line pad regions WP arranged in the first direction X will be described in more detail below with reference to FIG. 10 together with FIGS. 3 to 9B.

Referring to FIG. 10, together with FIGS. 3-6, 7A, 7B, 8A, 8B, 9A and 9B, third and fourth gate groups GG3 and GG4 may be sequentially stacked above the first and second gate groups GG1 and GG2 (see, e.g., FIG. 9A). The third and fourth gate groups GG3 and GG4 may have a structure similar to that of the first and second gate groups GG1 and GG2 described with reference to FIG. 9A. For example, among gate electrodes GE of each of the third and fourth gate groups GG3 and GG4, relatively lower electrodes may extend relatively further in the first direction X.

Among the gate electrodes GE of the first to fourth gate groups GG1 to GG4, a region between an end of a lowermost gate electrode and an end of an uppermost gate electrode in the first direction X may be defined as a unit pattern region Pu. Thus, the unit pattern region Pu may include pad regions WP of the first to third gate groups GG1 to GG3, and need not include a pad region WP of the fourth gate group GG4.

In an exemplary embodiment of the present inventive concept, lengths La3, La2 and La1 of the pad regions WP in the first direction X in the unit pattern region Pu may be substantially equal to each other, but exemplary embodiments of the present inventive concept are not limited thereto. For example, the lengths La3, La2 and La1 of the pad regions WP in the first direction X in the unit pattern region Pu may be different from each other.

Referring to FIG. 9A, in the first gate group GG1, the first lower electrode GE1a may extend by a first length D1, further than the first upper electrode GE1d, in the first direction X. In the second gate group GG2, the second lower electrode GE2a may extend by a second length D2, further than the second upper electrode GE2d, in the first direction X, the second length D2 being greater than the first length D1. In the third gate group GG3, a lowermost lower electrode may extend by a third length D3, further than an uppermost upper electrode, in the first direction X, the third length D3 being greater than the second length D2, and in the fourth gate group GG4, a lowermost lower electrode may extend by a fourth length D4, further than an uppermost upper electrode, in the first direction X, the fourth length D4 being greater than the third length D3.

Thus, each of the first to fourth gate groups GG1 to GG4 may include a plurality of gate electrodes GE, and a lowest gate electrodes GE, among the plurality of gate electrodes GE, may extend relatively further in the first direction X than other gate electrodes GE above the lowest gate electrode GE.

An exemplary embodiment of the present inventive concept will be described in more detail below with reference to FIG. 11.

Figure 11:
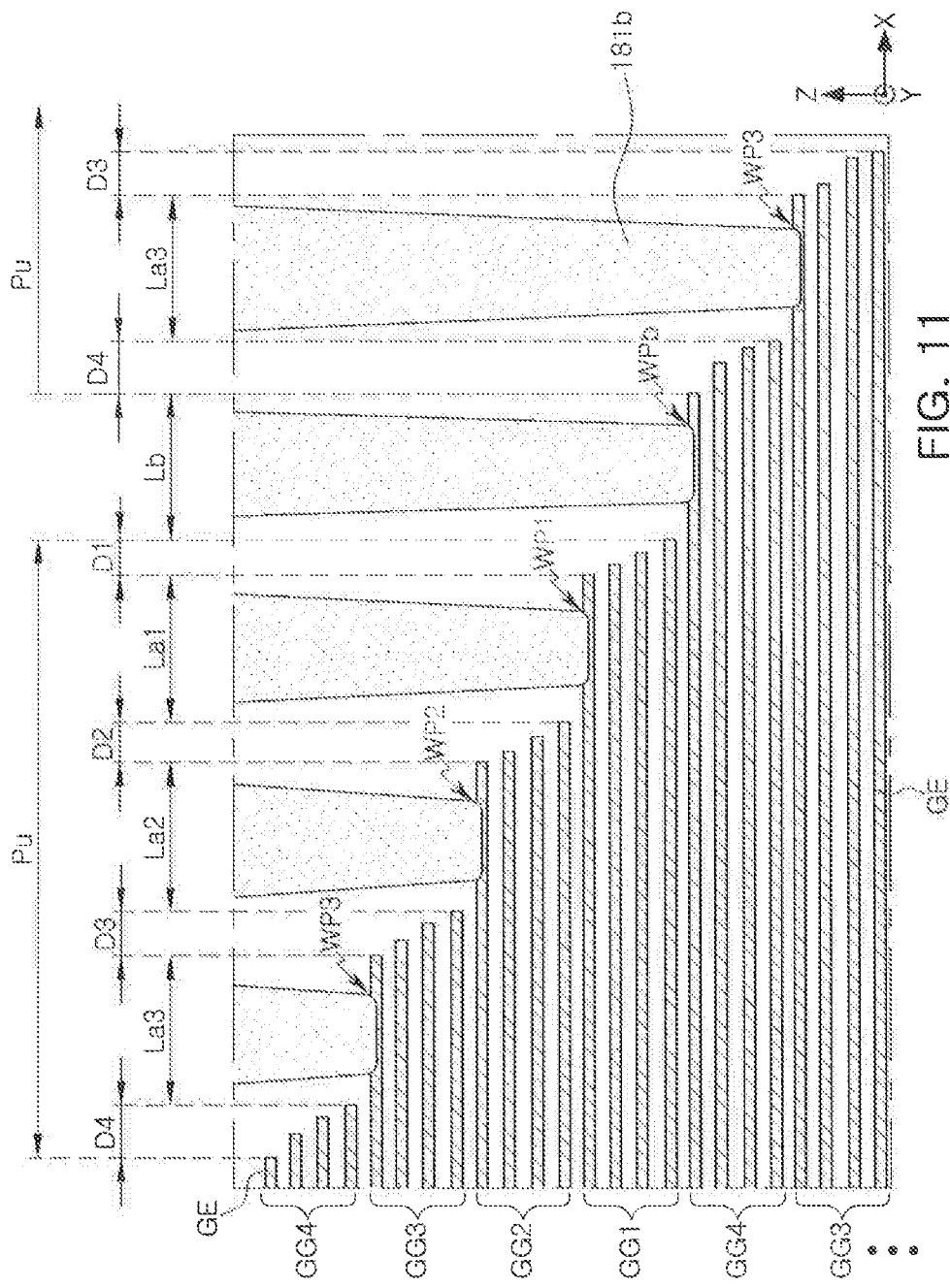
FIG. 11 is a partially enlarged view illustrating an example of a semiconductor device according to an exemplary embodiment of the present inventive concept.

FIG. 11 is a partially enlarged view illustrating an example of a semiconductor device according to an exemplary embodiment of the present inventive concept.

FIG. 11 illustrates word line pad regions WP (see, e.g., FIG. 8A) according to an exemplary embodiment of the present inventive concept.

The word line pad regions WP arranged in the first direction X will be described in more detail below with reference to FIG. 11, together with FIGS. 3-6, 7A, 7B, 8A, 8B, 9A, 9B and 10.

Referring to FIG. 11 together with FIGS. 3-6, 7A, 7B, 8A, 8B, 9A, 9B and 10, the unit pattern region Pu (see, e.g., FIG. 10), may be arranged as a plurality of unit pattern regions. For example, referring to FIG. 11, between the unit pattern region Pu and the unit pattern region Pu, one intermediate pad region WP' having a length Lb, different from the lengths La1, La2 and La3 of the pad regions WP in the first direction X in the unit pattern region Pu, may be disposed. An example of the intermediate pad region WP' will be described in more detail below with reference to FIG. 12 together with FIG. 11.

Figure 12:
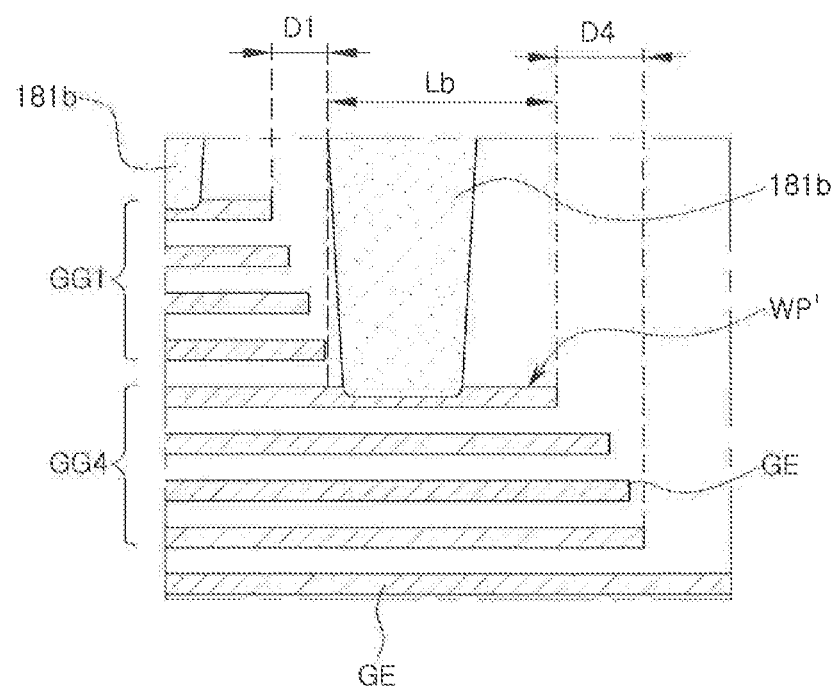
FIG. 12 is a partially enlarged view illustrating an example of a semiconductor device according to an exemplary embodiment of the present inventive concept.

FIG. 12 is a partially enlarged view illustrating an example of a semiconductor device according to an exemplary embodiment of the present inventive concept.

With reference to FIGS. 11 and 12, the length Lb of the intermediate pad region WP' in the first direction X may be shorter than the respective lengths La1, La2 and La3 of the pad regions WP in the first direction X in the unit pattern region Pu. The contact plug 181b may be disposed on the intermediate pad region WP'. The contact plug 181b may have a width increasing from a portion thereof contacting the intermediate pad region WP' to an upper portion thereof. Even when the contact plug 181b having such a shape is formed, since ends of the gate electrodes GE in the gate group GG1 are arranged as described with respect to FIG. 9A, bridge defects may be prevented from occurring between gate electrodes GE adjacent to the contact plug 181b, and the contact plug 181b.

FIGS. 13A, 13B, 14A, 14B, 15A, 15B, 16A, 16B, 17, 18A, 18B, 18C, 18D, 19A, 19B, 20A, 20B, 21A, 21B, 22, 23A and 23B are cross-sectional views illustrating an example of a method of manufacturing a semiconductor device according to an exemplary embodiment of the present inventive concept.

Referring to FIGS. 13A, 13B, 14A, 14B, 15A, 15B, 16A and 16B, an example of a method of forming a step shape of the string select lines SSL arranged in the first direction X and the second direction Y, and a step shape of the word lines WL arranged in the second direction Y will be described in more detail below.

In FIGS. 13A, 13B, 14A, 14B, 15A, 15B, 16A and 16B, FIGS. 13A, 14A, 15A and 16A are cross-sectional views illustrating a region taken along line IV-IV' of FIG. 3, and FIGS. 13B, 14B, 15B and 16B are cross-sectional views illustrating a region taken along line II-II' of FIG. 3 and a region taken along line III-III' of FIG. 3.

Figure 13A:
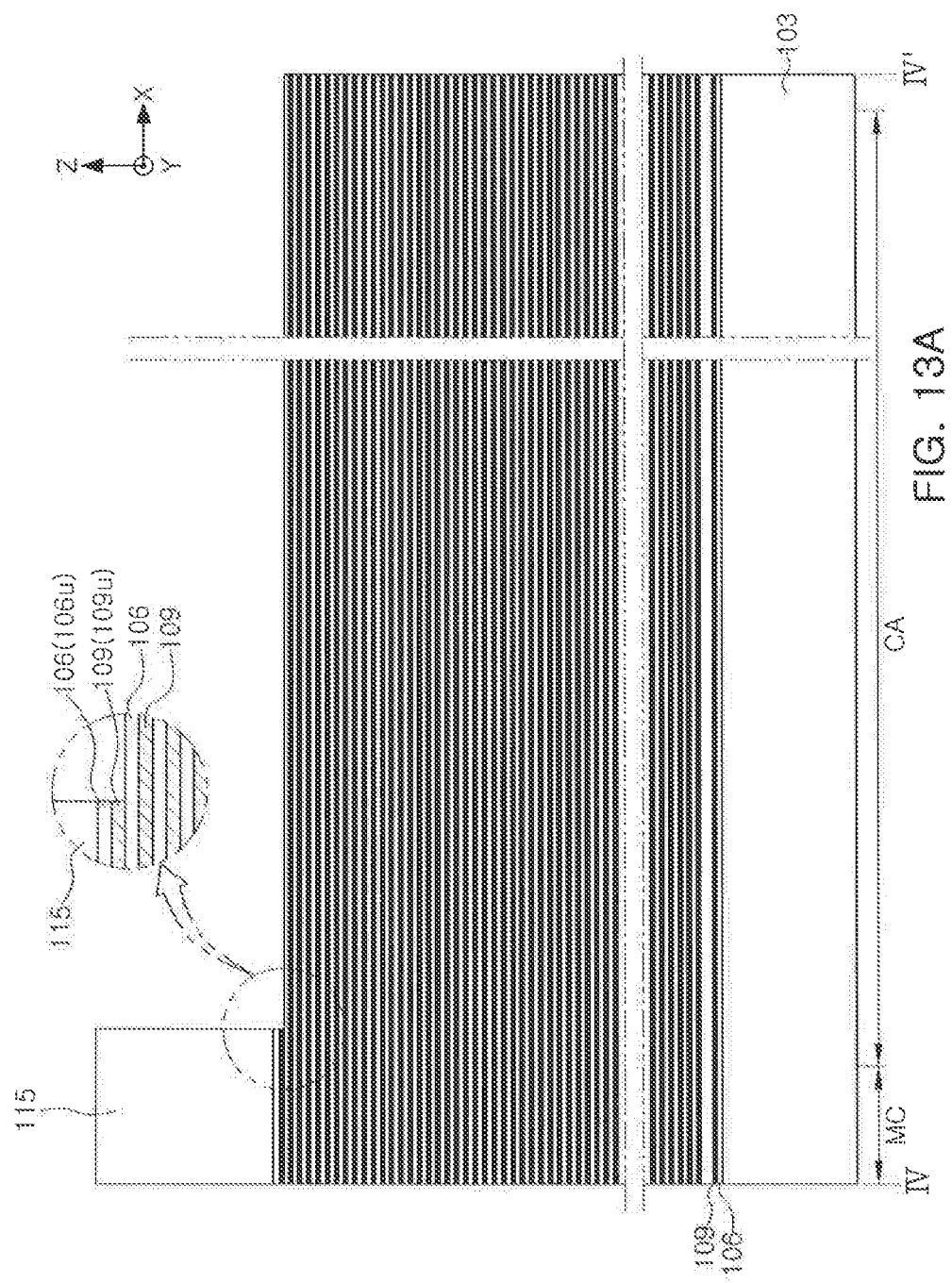
Figure 13B:
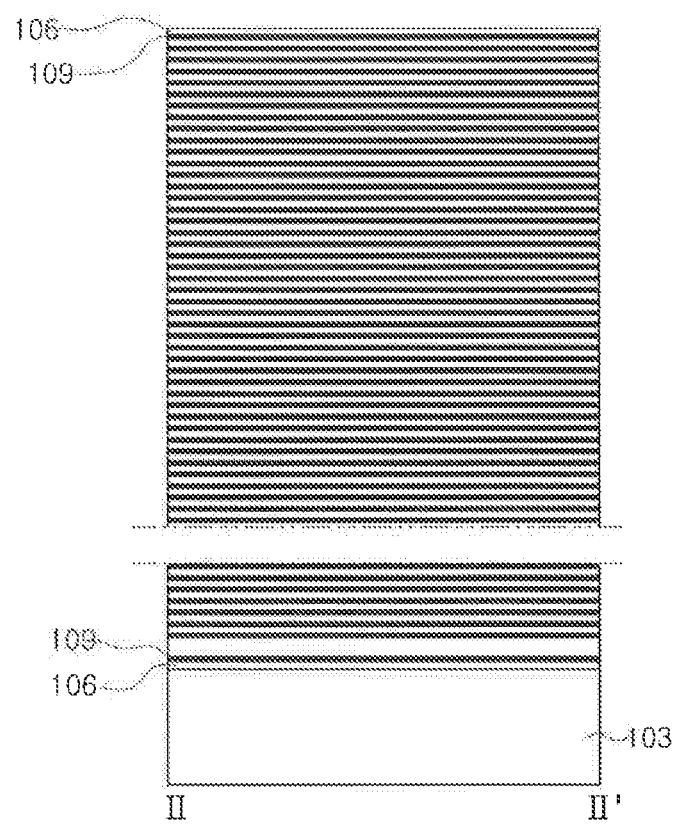

With reference to FIGS. 13A and 13B, a mold structure may be formed on a surface of the substrate 103 including the memory cell region MC and the contact region CA. The mold structure may include an interlayer insulating layer 106 and a sacrificial layer 109, alternately and repeatedly stacked. A lowermost layer and an uppermost layer of the mold structure may be interlayer insulating layers 106. The interlayer insulating layer 106 may include silicon oxide, and the sacrificial layer 109 may include silicon nitride.

A first mask pattern 115 may be formed on the mold structure. The first mask pattern 115 may be a photoresist pattern defining the uppermost string select lines SSL described with reference to FIGS. 3-6, 7A, 7B, 8A and 8B.

An uppermost step may be formed by etching an uppermost interlayer insulating layer 106u and an uppermost sacrificial layer 109u using the first mask pattern 115 as an etching mask.

With reference to FIGS. 14A, 14B, 15A, 15B, 16A and 16B, a second mask pattern 122a may be formed on the substrate 103 after the first mask pattern 115 (see, e.g., FIGS. 13A and 13B) is removed. The second mask pattern 122a may include a first portion 118 covering a region in which the string select lines SSL (see, e.g., FIG. 8A) are to be formed in the contact region CA, while covering the memory cell region MC, and a second portion 120 spaced apart from the first portion 118 and formed to have a quadrangular shape.

Figure 14A:
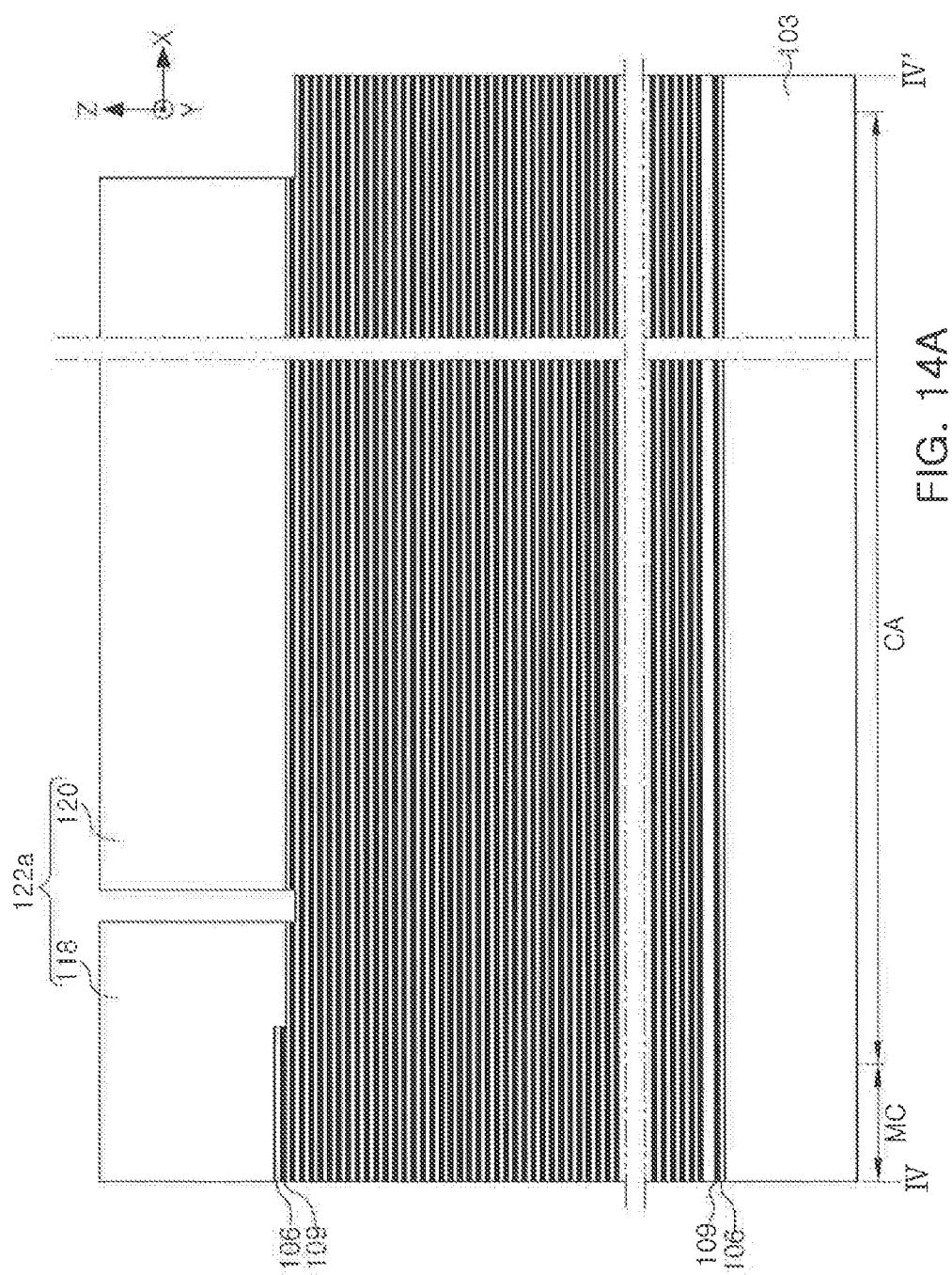
Figure 14B:
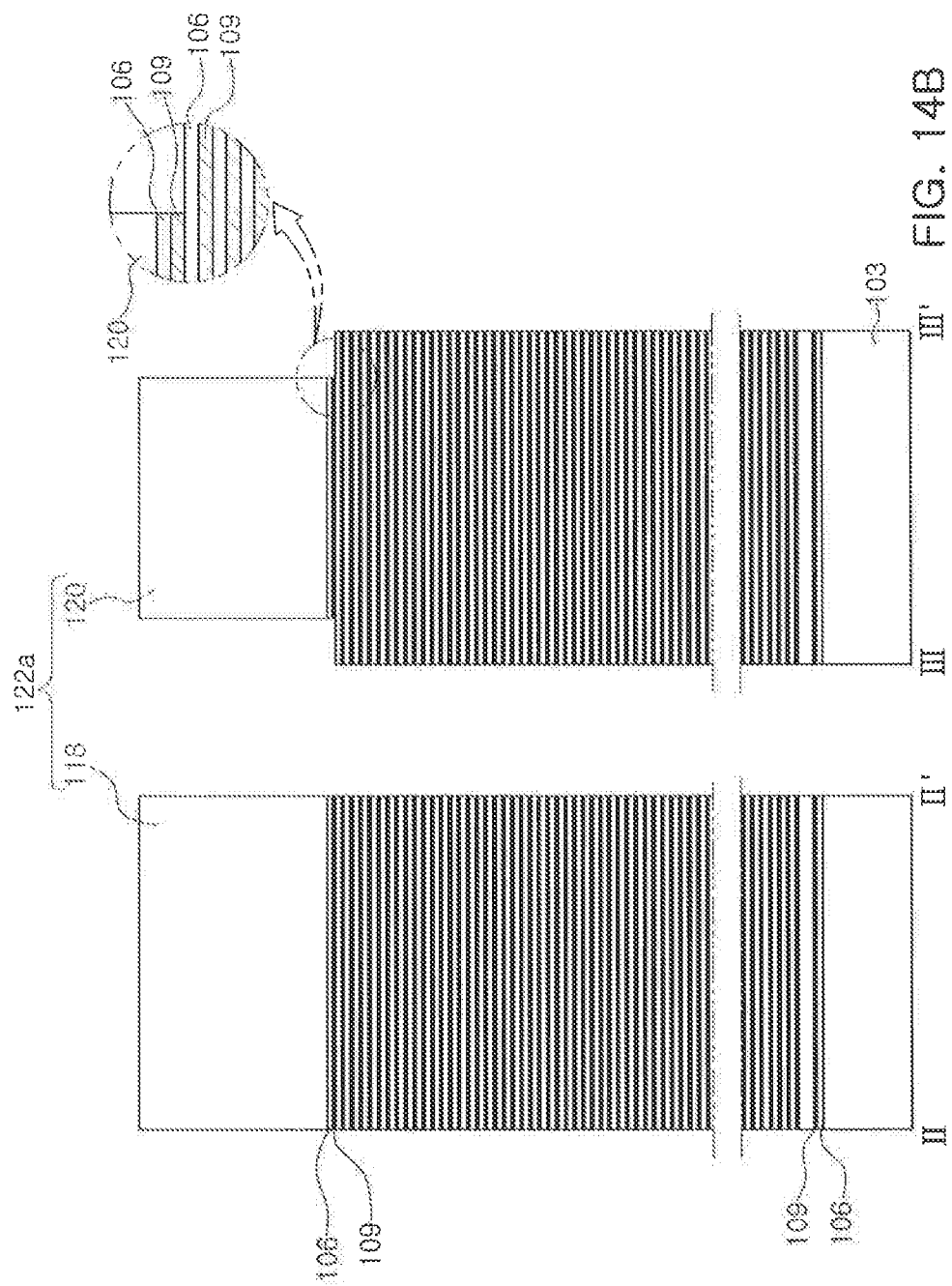

Referring to FIGS. 14A and 14B, one interlayer insulating layer 106 and one sacrificial layer 109, not covered by the second mask pattern 122a, may be sequentially etched using the second mask pattern 122a as an etching mask, thus forming a step.

Figure 15A:
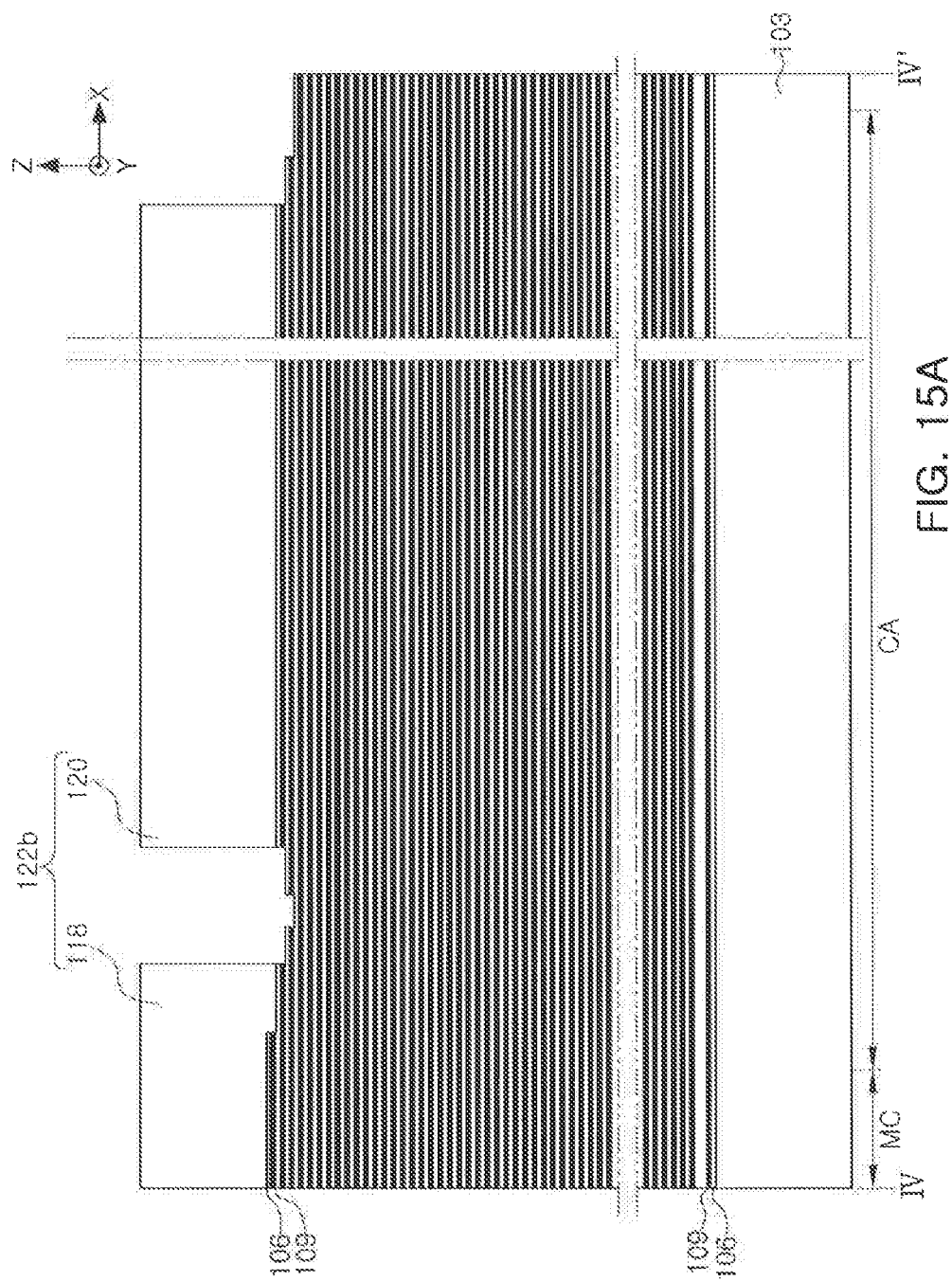
Figure 15B:
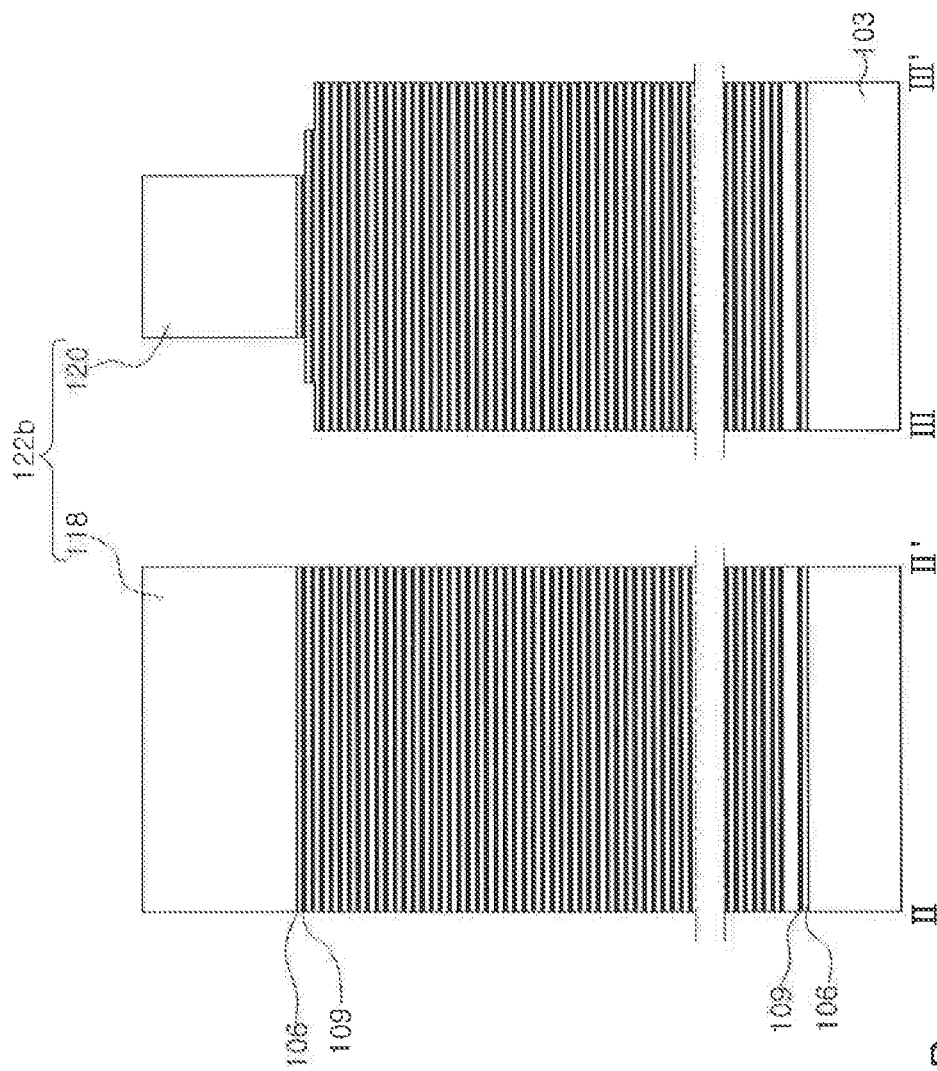

Referring to FIGS. 15A and 15B, after a first trimming process of reducing a size of the second mask pattern 122a is performed, one interlayer insulating layer 106 and one sacrificial layer 109, not covered by a second mask pattern 122b having been reduced in size, may be sequentially etched using the reduced second mask pattern 122b, thus forming a step.

Figure 16B:
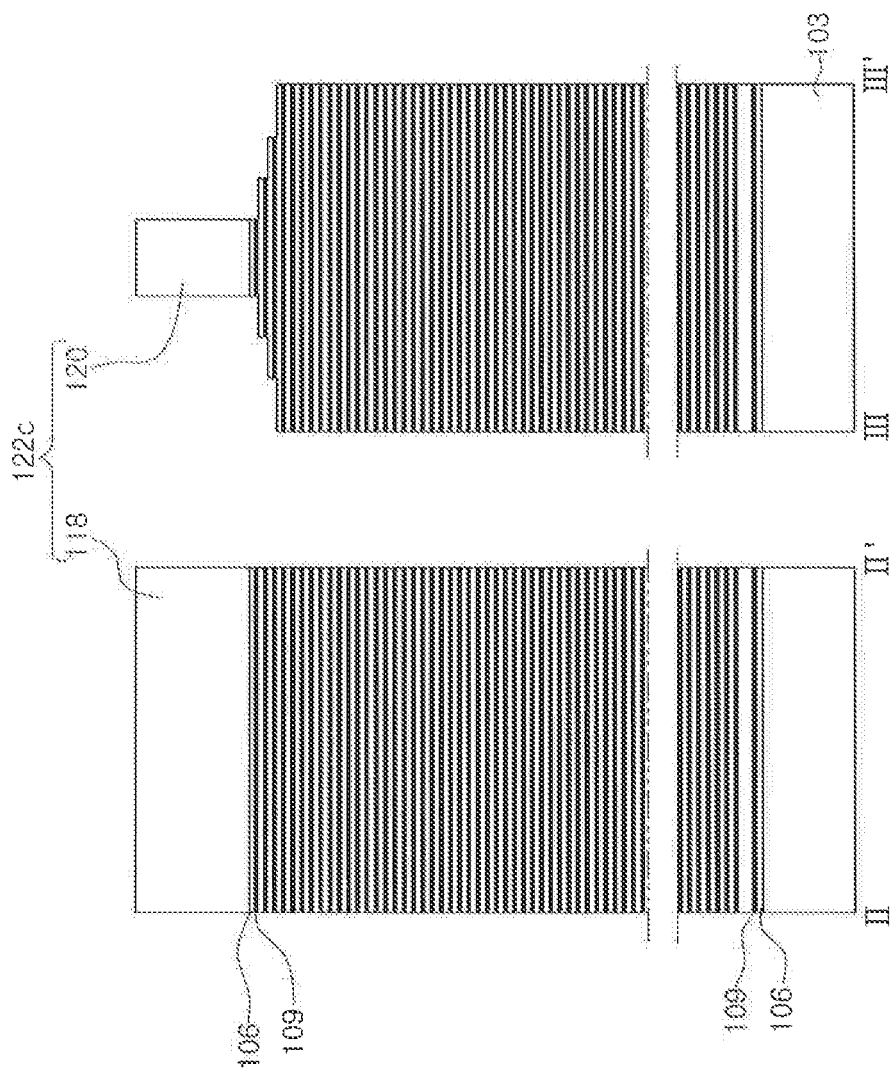

Referring to FIGS. 16A and 16B, after a second trimming process of reducing a size of the second mask pattern 122b is performed, one interlayer insulating layer 106 and one sacrificial layer 109, not covered by a second mask pattern 122c having been reduced in size, may be sequentially etched using the reduced second mask pattern 122c, thus forming a step.

Subsequently, the second mask pattern 122c may be removed.

Thus, referring to FIGS. 14A, 14B, 15A, 15B, 16A and 16B, the first portion 118 of the second mask pattern 122a-122c may be reduced in size in a step-by-step manner, such that steps, sequentially lowered in the vertical direction Z, may be formed, and the second portion 120 of the second mask pattern 122a-122c, having a quadrangular shape, may be reduced in size in a step-by-step manner, such that steps sequentially lowered in the vertical direction Z may be formed in the first direction X and in the second direction Y. The second portion 120 of the second mask pattern 122a-122c, ultimately remaining, may cover a region in which the word line pad regions WP, described with reference to FIGS. 3-6, 7A, 7B, 7A and 8B, are to be formed.

Figure 17:
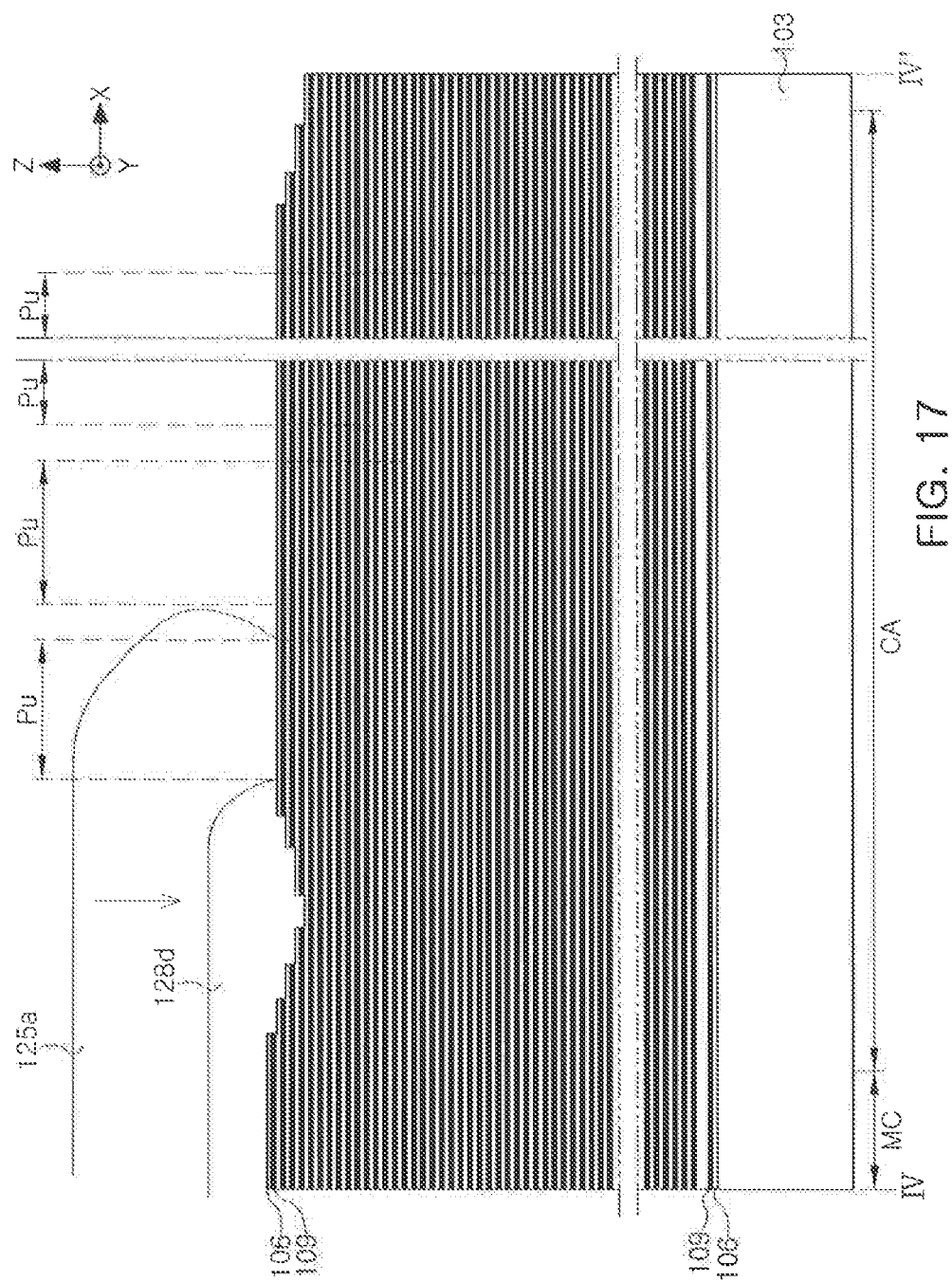

A semiconductor device according to an exemplary embodiment of the present inventive concept may include the word line pad regions WP arranged in the first direction X as described previously with reference to FIGS. 3, 8A and 8B. An example of a method of forming the word line pad regions WP will be described in more detail below with reference to FIG. 17 and FIGS. 18A, 18B, 18C, 18D, 19A, 19B, 20A, 20B, 21A, 21B and 22. FIG. 17 is a cross-sectional view illustrating a region taken along line IV-IV' of FIG. 3, and FIGS. 18A, 18B, 18C, 18D, 19A, 19B, 20A, 20B, 21A, 21B and 22 are partially enlarged views illustrating a portion illustrated in FIG. 17.

Referring to FIGS. 3-6, 7A, 7B, 8A, 81B, 9A, 9B, 10-12, 13A, 13B, 14A, 14B, 15A, 15B, 16A, 16B and 17, the substrate 103 from which the second mask pattern 122a-122c described with reference to FIGS. 16A and 16B has been removed may be prepared. A first word line pad mask 125a may be formed on the prepared substrate 103. The first word line pad mask 125a may be formed of a photoresist pattern. The first word line pad mask 125a may cover a portion of the contact region CA, while covering the memory cell region MC. The first word line pad mask 125a may have an outwardly convex side.

Referring to FIGS. 3, 8A and 8B, stepped end portions of the word lines WL may be disposed between word line pad regions WP arranged in the first direction X. An example of a method of forming the stepped end portions of the word lines WL as described above will be described in more detail below with reference to FIGS. 18A, 18B, 18C and 18D.

Referring to FIGS. 17 and 18A, one interlayer insulating layer 106 and one sacrificial layer 109, not covered by the first word line pad mask 125a, may be etched and removed using the first word line pad mask 125a as an etching mask.

Referring to FIG. 18B, the size of the first word line pad mask 125a may be reduced to form a reduced first word line pad mask 125b. Thus, using the reduced first word line pad mask 125b as an etching mask, one interlayer insulating layer 106 and one sacrificial layer 109, not covered by the reduced first word line pad mask 125b, may be etched and removed.

Referring to FIG. 18C, a reduced first word line pad mask 125c may be obtained by reducing the size of the first word line pad mask 125b, and one interlayer insulating layer 106 and one sacrificial layer 109, not covered by the reduced word line pad mask 125c, may be etched and removed using the reduced first word line pad mask 125c as an etching mask.

Figure 18D:
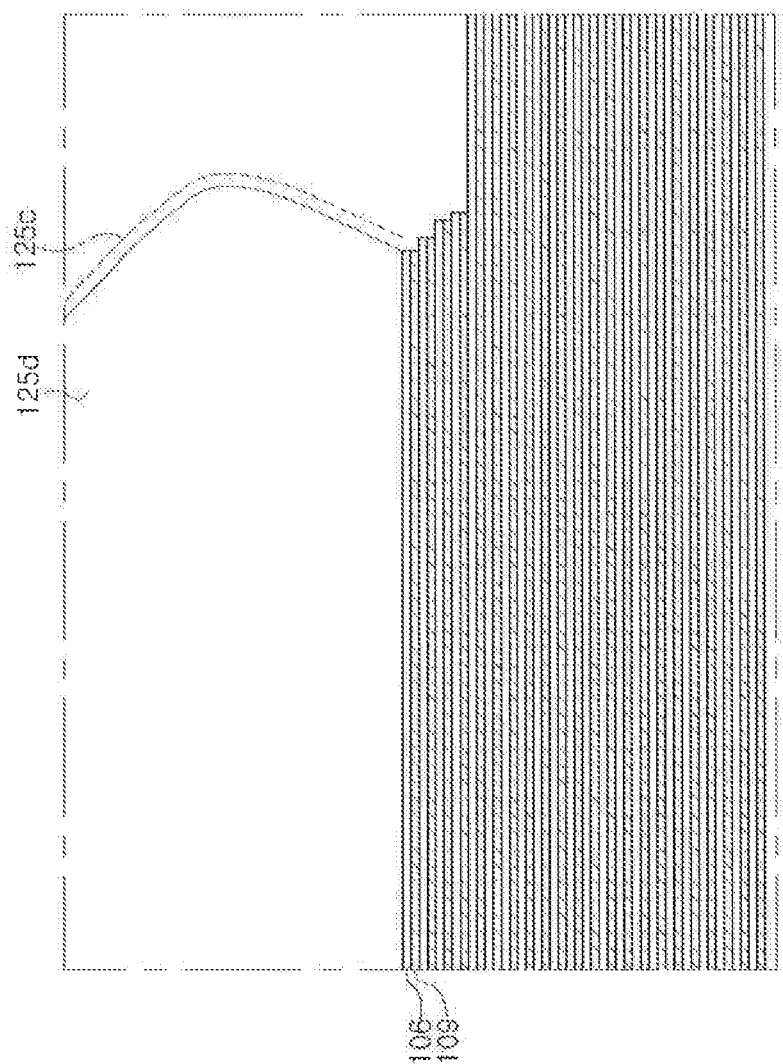

Referring to FIG. 18D, a reduced first word line pad mask 125d may be obtained by reducing the size of the reduced first word line pad mask 125c, and one interlayer insulating layer 106 and one sacrificial layer 109, not covered by the reduced first word line pad mask 125d, may be etched and removed using the reduced first word line pad mask 125d as an etching mask.

Figure 19A:
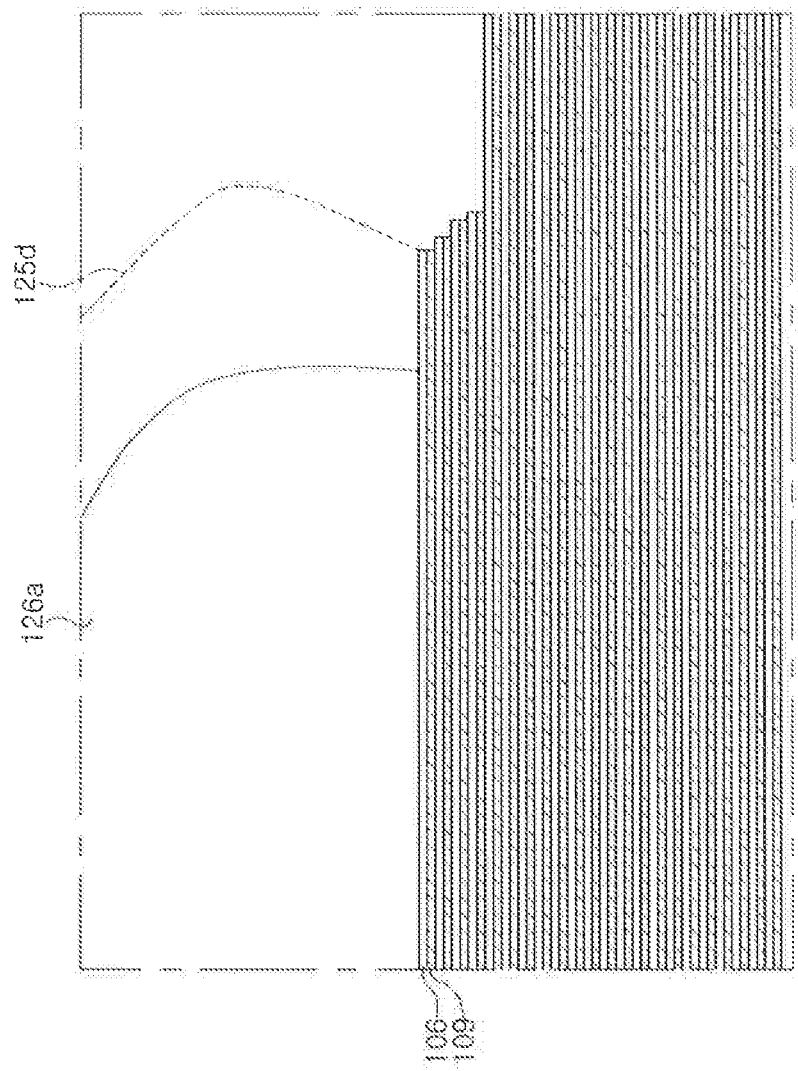

Referring to FIG. 19A, as described with reference to FIGS. 3, 8A and 8B, the size of the first word line pad mask 125d may be reduced by a length, in the first direction X, of the word line pad regions WP arranged in the first direction X, thus forming a reduced first word line pad mask 126a.

Referring to FIG. 19B, the process described previously with reference to FIGS. 18A, 18B, 18C and 18D may be repeated using the first word line pad mask 126a to reduce the size of the first word line pad mask 126a, and an etching process using the reduced first word line pad mask 126a-126d may be performed to form stepped ends of the sacrificial layers 109 that may be replaced with the word lines WL.

With reference to FIGS. 20A, 20B, 21A and 21B, the process described with reference to FIGS. 19A and 19B may be repeatedly performed for the first word line pad mask 126d, to sequentially reduce the size of the first word line pad mask 126d, and the etching process described with reference to FIGS. 19A and 19B may be repeatedly performed using the first word line pad mask (e.g., 127a, 127d, 128a) sequentially reduced in size. Thus, ends of sacrificial layers corresponding to the end portions of the gate electrodes described in FIG. 10 may be formed. Thus, sacrificial layers 109 having the same shape and size as those of the gate electrodes GE in the unit pattern region Pu described with reference to FIG. 11 may be formed.

Figure 22:
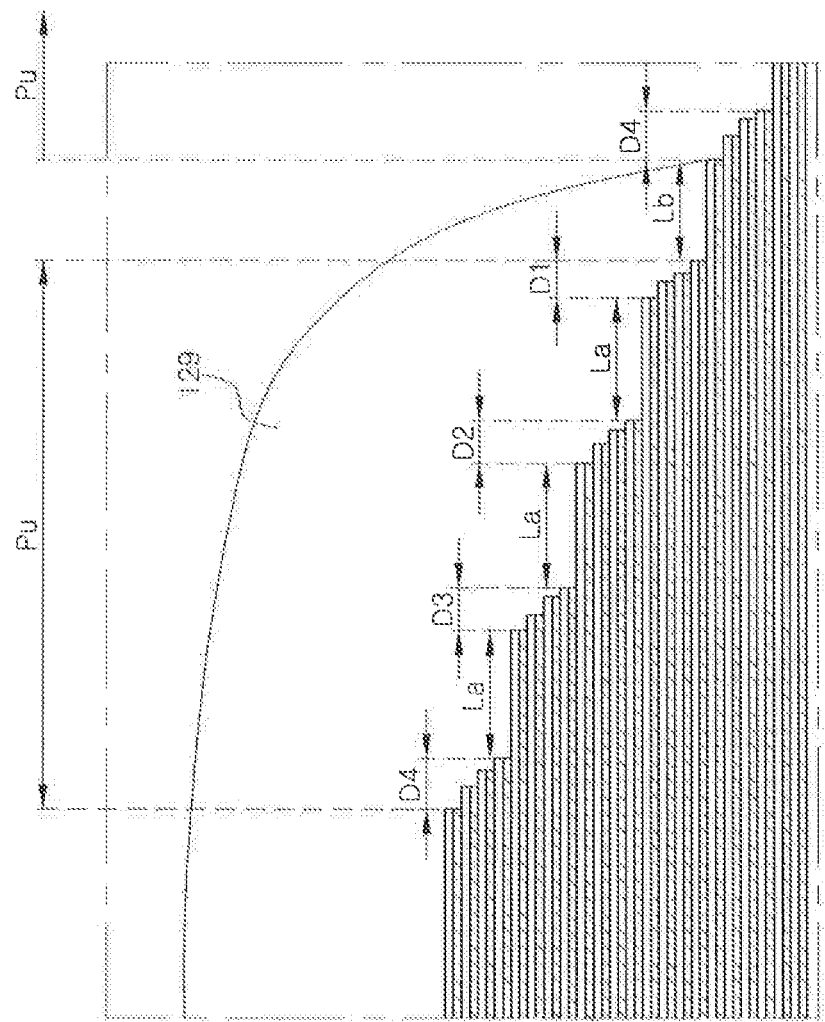

Referring to FIG. 22, the process described with reference to FIGS. 18A, 1813B, 18C. 18D, 19A, 19B, 20A, 20B, 21A and 21B may be repeatedly performed using a second word line pad mask 129, to form sacrificial layers 109 having the same shape and size as those of the electrodes GE in the unit pattern region Pu as described above.

Figure 23A:
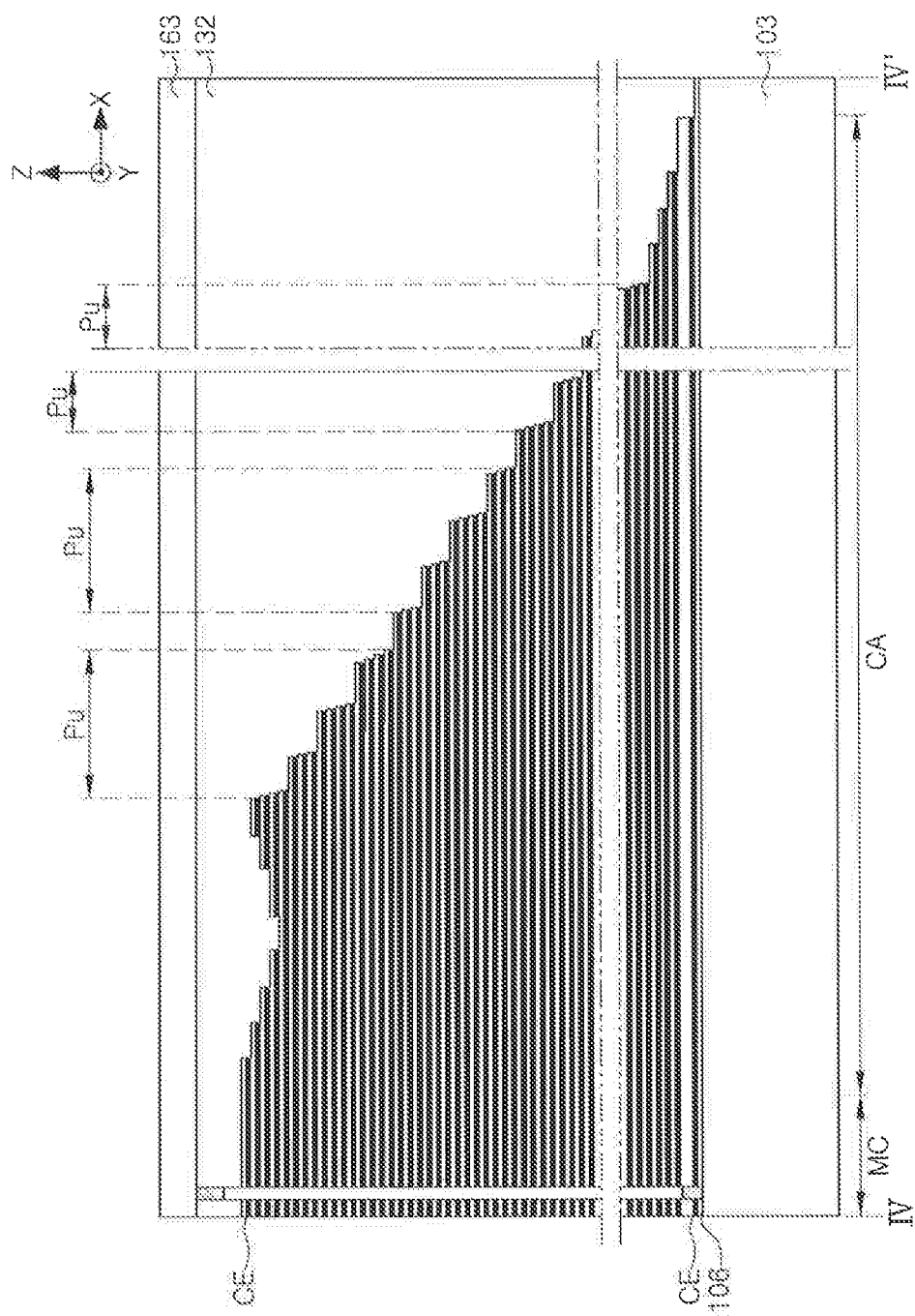
Figure 23B:
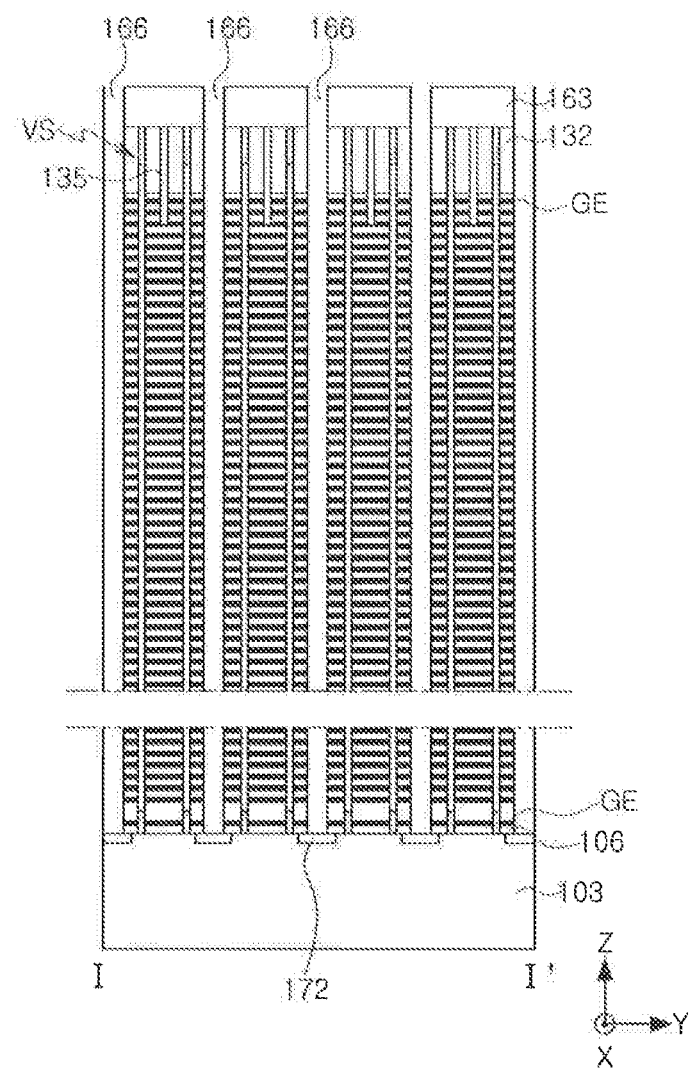

Referring to FIGS. 23A and 23B, after the process of forming the ends of the sacrificial layers 109 (see. e.g., FIGS. 13A, 13B, 14A, 14B, 15A, 15B, 16A, 16B, 17, 18A, 18B, 18C, 18D, 19A, 19B, 20A. 20B, 21A, 21B and 22) is performed, a first capping insulating layer 132 may be formed. An insulating pattern 135, penetrating through the first capping insulating layer 132 and penetrating through an uppermost sacrificial layer and a next highest sacrificial layer among the sacrificial layers 109 (see, e.g., FIGS. 13A, 13B, 14A, 14B, 15A, 15B, 16A, 16B, 17, 18A, 18B, 18C, 18D, 19A, 19B, 20A, 20B, 21A, 21B and 22) may be formed.

Vertical structures VS, penetrating through the first capping insulating layer 132 and penetrating through the sacrificial layers 109 (see, e.g., FIGS. 13A, 13B, 14A, 14B, 15A, 15B, 16A, 16B, 17, 18A, 18B, 18C, 18D, 19A, 19B, 20A, 20B, 21A, 21B and 22), may be formed. A second capping insulating layer 163 may be formed on the first capping insulating layer 132, to cover the vertical structures VS.

Trenches 166 may be formed to expose the substrate 103 while penetrating through the first and second capping insulating layers 132 and 163, the sacrificial layers 109 (see, e.g., FIGS. 13A, 13B, 14A, 14B, 15A, 15B, 16A, 16B, 17, 18A, 18B, 18C, 18D, 19A, 19B, 20A, 20B, 21A, 21B and 22), and the interlayer insulating layers 106. The sacrificial layers 109 may be exposed by the trenches 166. A gate replacement process may be performed to replace the sacrificial layers 109 with gate electrodes GE. For example, the sacrificial layers 109 (see, e.g., FIGS. 13A, 13B, 14A. 14B, 15A, 15B, 16A, 16B, 17, 18A, 18B, 18C, 18D, 19A, 19B, 20A, 20B, 21A, 21B and 22) may be selectively removed to form empty spaces, and the empty spaces may be filled with the gate electrodes GE. Source structures CS (see, e.g., FIGS. 3-6, 7A, 7B, 8A and 8B) may be formed in the trenches 166.

According to an exemplary embodiment of the present inventive concept, since a semiconductor device may includes gate electrodes GE having pad regions GP and WP capable of preventing bridge failure with the contact plug 181b, productivity of the semiconductor device may be increased, and the reliability thereof may be further increased.

A semiconductor device according to an exemplary embodiment of the present inventive concept includes gate electrodes including pad regions in which bridge defects with contact plugs may be prevented, and thus the productivity and reliability of the semiconductor device according to an exemplary embodiment of the present inventive concept may be increased.

While example embodiments have been shown and described above, it will be apparent to those skilled in the art that modifications and variations could be made without departing from the scope of the present inventive concept.

What is claimed is:

1. A semiconductor device comprising:
a plurality of gate groups stacked on a substrate;
a structure in a trench penetrating through the plurality of gate groups; and
a plurality of contact plugs on a plurality of pad regions of the plurality of gate groups,
wherein the plurality of gate groups include a first gate group and a second gate group on the first gate group,
wherein at least a portion of the trench extends in a first horizontal direction,
wherein the first gate group includes:
a first lower electrode;
a first intermediate electrode disposed on the first lower electrode; and
a first upper electrode including a first pad region and disposed on the first intermediate electrode,
wherein the second gate group includes:
a second lower electrode;
a second intermediate electrode disposed on the second lower electrode; and
a second upper electrode including a second pad region and disposed on the second intermediate electrode,
wherein the first lower electrode includes:
a first lower overlap portion overlapping the first intermediate electrode in a vertical direction; and
a first lower extending portion not overlapping the first intermediate electrode in the vertical direction and extending from the first lower overlap portion in the first horizontal direction,
wherein the first intermediate electrode includes:
a first intermediate overlap portion overlapping the first upper electrode in the vertical direction; and
a first intermediate extending portion not overlapping the first upper electrode in the vertical direction and extending from the first intermediate overlap portion in the first horizontal direction,
wherein the second lower electrode includes:
a second lower overlap portion overlapping the second intermediate electrode in the vertical direction; and
a second lower extending portion not overlapping the second intermediate electrode in the vertical direction and extending from the second lower overlap portion in the first horizontal direction,
wherein the second intermediate electrode includes:
a second intermediate overlap portion overlapping the second upper electrode in the vertical direction; and
a second intermediate extending portion not overlapping the second upper electrode in the vertical direction and extending from the second intermediate overlap portion in the first horizontal direction,
wherein the plurality of contact plugs include a first contact plug contacting the first pad region and a second contact plug contacting the second pad region,
wherein a distance between the first intermediate electrode and the first lower electrode is the same as a distance between the second intermediate electrode and the second lower electrode in the vertical direction,
wherein a length in the first horizontal direction of the second lower extending portion is greater than a length in the first horizontal direction of the first lower extending portion, and
wherein a length in the first horizontal direction of the first and second pad regions is greater than the length in the first horizontal direction of the second lower extending portion.

2. The semiconductor device of claim 1, wherein a width in the first horizontal direction of each of the first and second contact plugs is greater than a sum of the length in the first horizontal direction of the second lower extending portion and a length in the first horizontal direction of the second intermediate extending portion, and
wherein the length in the first horizontal direction of the second intermediate extending portion is greater than the length in the first horizontal direction of the second lower extending portion.

3. The semiconductor device of claim 2, further comprising:
a third intermediate electrode between the first intermediate electrode and the first upper electrode; and
a fourth intermediate electrode between the second intermediate electrode and the second upper electrode,
wherein the third intermediate electrode includes:
a third intermediate overlap portion overlapping the first upper electrode in the vertical direction; and
a third intermediate extending portion not overlapping the first upper electrode in the vertical direction and extending from the third intermediate overlap portion in the first horizontal direction,
wherein the fourth intermediate electrode includes:
a fourth intermediate overlap portion overlapping the second upper electrode in the vertical direction; and
a fourth intermediate extending portion not overlapping the second upper electrode in the vertical direction and extending from the fourth intermediate overlap portion in the first horizontal direction.

4. The semiconductor device of claim 3, wherein a length in the first horizontal direction of the first intermediate extending portion is greater than a length in the first horizontal direction of the third intermediate extending portion, and
wherein a length in the first horizontal direction of the second intermediate extending portion is greater than a length in the first horizontal direction of the fourth intermediate extending portion.

5. The semiconductor device of claim 3,
wherein the second intermediate electrode includes:
an overlap portion overlapping the fourth intermediate electrode in the vertical direction; and
a non-overlap portion not overlapping the fourth intermediate electrode in a vertical direction and extending from the overlap portion in the first horizontal direction,
wherein a length in the first horizontal direction of the fourth intermediate extending portion is greater than a length in the first horizontal direction of the non-overlap portion of the second intermediate electrode, and
wherein the length in the first horizontal direction of the non-overlap portion of the second intermediate electrode is greater than the length in the first horizontal direction of the second lower extending portion.

6. The semiconductor device of claim 1, wherein the first contact plug and the second contact plug are adjacent to each other in the first horizontal direction,
wherein the first pad region of the first upper electrode does not overlap the second lower electrode,
wherein the first contact plug includes a first sidewall and a second sidewall opposing each other in the first horizontal direction, and a center between the first sidewall and the second sidewall,
wherein the center of the first contact plug is spaced apart from a sidewall of the second intermediate electrode by a first distance,
wherein the center of the first contact plug is spaced apart from a sidewall of the first upper electrode by a second distance, and
wherein the first distance is greater than the second distance.

7. The semiconductor device of claim 1, wherein the plurality of gate groups further include one or more gate groups between the first gate group and the second gate group,
wherein each of the one or more gate groups includes:
a third lower electrode;
one or more third intermediate electrodes disposed on the third lower electrode; and
a third upper electrode including a third pad region and disposed on the one or more third intermediate electrodes, and
wherein the plurality of contact plugs further include a third contact plug contacting the third pad region.

8. The semiconductor device of claim 1, further comprising first and second vertical structures penetrating through the plurality of gate groups,
wherein each of the first and second vertical structures includes a data storage layer,
wherein the trench is spaced apart from the vertical structures, and
wherein the structure in the trench includes an insulating material layer.

9. The semiconductor device of claim 1, further comprising:
a lower insulating layer on the substrate; and
a connection portion disposed below the plurality of gate groups and connecting the first and second vertical structures, wherein the first and second vertical structures, and the connection portion are disposed on the lower insulating layer.

10. A semiconductor device comprising:
a plurality of gate groups stacked on a substrate;
a structure in a trench penetrating through the plurality of gate groups; and
a plurality of contact plugs on a plurality of pad regions of the plurality of gate groups,
wherein the plurality of gate groups include a first gate group and a second gate group on the first gate group,
wherein at least a portion of the trench extends in a first horizontal direction,
wherein the first gate group includes:
  a first lower electrode;
  one or more first intermediate electrodes disposed on the first lower electrode; and
  a first upper electrode including a first pad region and disposed on the one or more first intermediate electrodes,
wherein the second gate group includes:
  a second lower electrode;
  one or more second intermediate electrodes disposed on the second lower electrode; and
  a second upper electrode including a second pad region and disposed on the one or more second intermediate electrodes,
wherein the first lower electrode includes:
  a first lower overlap portion overlapping the first upper electrode in a vertical direction; and
  a first lower extending portion not overlapping the first upper electrode in the vertical direction and extending from the first lower overlap portion in the first horizontal direction,
wherein the second lower electrode includes:
  a second lower overlap portion overlapping the second upper electrode in the vertical direction; and
  a second lower extending portion not overlapping the second upper electrode in the vertical direction and extending from the second lower overlap portion in the first horizontal direction,
wherein a length in the first horizontal direction of the second lower extending portion is greater than a length in the first horizontal direction of the first lower extending portion,
wherein the plurality of contact plugs include a first contact plug contacting the first pad region and a second contact plug contacting the second pad region,
wherein a width in the first horizontal direction of each of the first and second contact plugs is greater than the length in the first horizontal direction of the second lower extending portion,
wherein the first pad region of the first upper electrode does not overlap the second lower electrode,
wherein the first contact plug includes a first sidewall and a second sidewall opposing each other in the first horizontal direction, and a center between the first sidewall and the second sidewall,
wherein a distance between the center of the first contact plug and a sidewall of each of the one or more second intermediate electrodes is greater than a distance between the center of the first contact plug and a sidewall of the first upper electrode,
wherein the sidewall of each of the one or more second intermediate electrodes faces the first sidewall of the first contact plug, and
wherein the sidewall of the first upper electrode faces a sidewall of the second contact plug.

11. The semiconductor device of claim 10, wherein a distance between the center of the first contact plug and a sidewall of each of the one or more second intermediate electrodes is greater than a distance between the center of the first contact plug and a sidewall of the second lower electrode.

12. The semiconductor device of claim 11, wherein the distance between the center of the first contact plug and the sidewall of each of the one or more second intermediate electrodes is smaller than a distance between the center of the first contact plug and a sidewall of the second upper electrode.

13. The semiconductor device of claim 12, wherein the sidewall of the second lower electrode and the sidewall of the second upper electrode face the first sidewall of the first contact plug.

14. The semiconductor device of claim 11, wherein the plurality of gate groups further include a third gate group on the second gate group, and
wherein the second pad region does not overlap a plurality of gate electrodes of the third gate group.

15. The semiconductor device of claim 11, wherein a length in the first horizontal direction of the first pad region is the same as a length in the first horizontal direction of the second pad region.

16. A semiconductor device comprising:
a plurality of gate groups stacked on a substrate;
a structure in a trench penetrating through the plurality of gate groups; and
a plurality of contact plugs on a plurality of pad regions of the plurality of gate groups,
wherein the plurality of gate groups include a first gate group and a second gate group on the first gate group,
wherein at least a portion of the trench extends in a first horizontal direction,
wherein the first gate group includes:
  a first lower electrode;
  a first intermediate electrode disposed on the first lower electrode; and
  a first upper electrode including a first pad region and disposed on the first intermediate electrode,
wherein the second gate group includes:
  a second lower electrode;
  a second intermediate electrode disposed on the second lower electrode; and
  a second upper electrode including a second pad region and disposed on the second intermediate electrode,
wherein the first lower electrode includes:
  a first lower overlap portion overlapping the first intermediate electrode in a vertical direction; and
  a first lower extending portion not overlapping the first intermediate electrode in the vertical direction and extending from the first lower overlap portion in the first horizontal direction,
wherein the first intermediate electrode includes:
  a first intermediate overlap portion overlapping the first upper electrode in the vertical direction; and
  a first intermediate extending portion not overlapping the first upper electrode in the vertical direction and extending from the first intermediate overlap portion in the first horizontal direction,
wherein the second lower electrode includes:
  a second lower overlap portion overlapping the second intermediate electrode in the vertical direction; and a second lower extending portion not overlapping the second intermediate electrode in the vertical direction and extending from the second lower overlap portion in the first horizontal direction, wherein the second intermediate electrode includes:
a second intermediate overlap portion overlapping the second upper electrode in the vertical direction; and
a second intermediate extending portion not overlapping the second upper electrode in the vertical direction and extending from the second intermediate overlap portion in the first horizontal direction, wherein the plurality of contact plugs include a first contact plug contacting the first pad region and a second contact plug contacting the second pad region, wherein a distance between the first intermediate electrode and the first lower electrode is the same as a distance between the second intermediate electrode and the second lower electrode in the vertical direction, wherein the first lower electrode and the first intermediate electrode have a first stair step structure in the first horizontal direction, wherein the second lower electrode and the second intermediate electrode have a second stair step structure in the first horizontal direction, and wherein a first angle between a slope of the first stair step structure and a top surface of the substrate is greater than a second angle between a slope of the second stair step structure and the top surface of the substrate.

17. The semiconductor device of claim 16, wherein the first lower electrode and the first upper electrode have a third stair step structure in the first horizontal direction, wherein the second lower electrode and the second upper electrode have a fourth stair step structure in the first horizontal direction, and wherein a third angle between a slope of the third stair step structure and the top surface of the substrate is greater than a fourth angle between a slope of the fourth stair step structure and the top surface of the substrate.

18. The semiconductor device of claim 16, wherein a width in the first horizontal direction of each of the first and second contact plugs is greater than a sum of a length in the first horizontal direction of the second lower extending portion and a length in the first horizontal direction of the second intermediate extending portion.

19. The semiconductor device of claim 16, wherein the first contact plug and the second contact plug are adjacent to each other in the first horizontal direction, wherein the first pad region of the first upper electrode does not overlap the second lower electrode, wherein the first contact plug includes a first sidewall and a second sidewall opposing each other in the first horizontal direction, and a center between the first sidewall and the second sidewall, wherein the center of the first contact plug is spaced apart from a sidewall of the second intermediate electrode by a first distance, wherein the center of the first contact plug is spaced apart from a sidewall of the first upper electrode by a second distance, and wherein the first distance is greater than the second distance.

20. The semiconductor device of claim 16, further comprising:
a third intermediate electrode between the first intermediate electrode and the first upper electrode; and
a fourth intermediate electrode between the second intermediate electrode and the second upper electrode, wherein the third intermediate electrode includes:
a third intermediate overlap portion overlapping the first upper electrode in the vertical direction; and
a third intermediate extending portion not overlapping the first upper electrode in the vertical direction and extending from the third intermediate overlap portion in the first horizontal direction, and wherein the fourth intermediate electrode includes:
a fourth intermediate overlap portion overlapping the second upper electrode in the vertical direction; and
a fourth intermediate extending portion not overlapping the second upper electrode in the vertical direction and extending from the fourth intermediate overlap portion in the first horizontal direction.

* * * * *